United States Patent
Lin et al.

(10) Patent No.: US 10,742,238 B2
(45) Date of Patent: Aug. 11, 2020

(54) FROZEN BITS BASED PRUNING AND EARLY TERMINATION FOR POLAR DECODING

(71) Applicant: QUALCOMM Incorporated, San Diego, CA (US)

(72) Inventors: Jamie Menjay Lin, San Diego, CA (US); Gabi Sarkis, San Diego, CA (US); Yang Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 173 days.

(21) Appl. No.: 15/967,592

(22) Filed: Apr. 30, 2018

(65) Prior Publication Data

US 2018/0323809 A1    Nov. 8, 2018

Related U.S. Application Data

(60) Provisional application No. 62/502,154, filed on May 5, 2017.

(51) Int. Cl.
*H03M 13/37* (2006.01)
*H04L 1/00* (2006.01)
(Continued)

(52) U.S. Cl.
CPC ....... *H03M 13/3738* (2013.01); *H03M 13/13* (2013.01); *H04L 1/00* (2013.01);
(Continued)

(58) Field of Classification Search
CPC ............. H03M 13/13; H03M 13/2906; H03M 13/1102; H03M 13/6356; H03M 13/1108;
(Continued)

(56) References Cited

U.S. PATENT DOCUMENTS

2018/0248564 A1*  8/2018  Kim ................... H03M 13/1575
2019/0260391 A1*  8/2019  Hui ...................... H03M 13/098

FOREIGN PATENT DOCUMENTS

WO    WO-2018087717 A1    5/2018

OTHER PUBLICATIONS

Coherent Logix Inc: "Early Block Discrimination with Polar Codes to Further Accelerate DCI Blind Detection", 3GPP Draft, R1-1701897 Early Block Discrimination with Polar Codes to Further Accelerate DCI Blind Detection, 3rd Generation Partnership Project (3GPP), Mobile Competence Centre, 650, Route Des Lucio, vol. RAN WG1, No. Athens, Feb. 13, 2017-Feb. 17, 2017, Feb. 12, 2017 (Feb. 12, 2017), XP051209060, 5 Pages, Retrieved from the Internet: URL:http://www.3gpp.org/ftp/Meetings_3GPP_SYNC/RAN1/Docs/ [retrieved on Feb. 12, 2017].

(Continued)

*Primary Examiner* — April Y Blair
*Assistant Examiner* — Sazzad Hossain
(74) *Attorney, Agent, or Firm* — Holland & Hart LLP

(57) ABSTRACT

Methods, systems, and devices for wireless communication are described. The examples described herein may enable a decoder to determine path metrics for various decoding paths based on identified frozen bit locations of a polar code. The path metric for a decoding path may be based on bit metrics determined for the identified frozen bit locations along the decoding path. Once the path metrics and bit metrics are determined, the decoder may compare these metrics to threshold criteria and determine whether to discard decoding paths based on the comparison. The techniques described herein for discarding decoding paths may allow the decoder to discard, prune, or disqualify certain decoding paths that are unlikely to provide an accurate representation of bits received from another device. Consequently, the decoder may be able to save power by termi- (Continued)

nating a decoding process early (i.e., early termination) if all paths are discarded, pruned, or disqualified.

28 Claims, 13 Drawing Sheets

(51) Int. Cl.
| | | |
|---|---|---|
| *H03M 13/13* | (2006.01) | |
| *H03M 13/11* | (2006.01) | |
| *H03M 13/00* | (2006.01) | |
| *H03M 13/45* | (2006.01) | |
| *H03M 13/15* | (2006.01) | |
| *H03M 13/29* | (2006.01) | |

(52) U.S. Cl.
CPC .......... *H04L 1/0045* (2013.01); *H04L 1/0053* (2013.01); *H04L 1/0057* (2013.01); *H03M 13/00* (2013.01); *H03M 13/1102* (2013.01); *H03M 13/1108* (2013.01); *H03M 13/151* (2013.01); *H03M 13/1575* (2013.01); *H03M 13/2906* (2013.01); *H03M 13/45* (2013.01); *H03M 13/451* (2013.01); *H03M 13/458* (2013.01); *H03M 13/6356* (2013.01); *H03M 13/6393* (2013.01)

(58) Field of Classification Search
CPC ......... H03M 13/1125; H03M 13/6393; H03M 13/151; H03M 13/1575; H03M 13/45; H03M 13/451; H03M 13/458; H03M 13/3738; H04L 1/0057; H04L 1/0013; H04L 1/0067; H04L 1/00; H04L 1/0053
See application file for complete search history.

(56) References Cited

OTHER PUBLICATIONS

Huawei et al., "Evaluation of Channel Coding Schemes for Control Channel", 3GPP TSG RAN WG1 Meeting #86b, R1-1608863, Oct. 14, 2016, 4 pages.

Huawei., et al., "Polar Code Construction for NR," 3GPP Draft; R1-1608862, 3GPP TSG RAN WG1 Meeting #86bis, Lisbon, Portugal, Oct. 9, 2016 (Oct. 9, 2016), 8 pages, Retrieved from the Internet: URL: http://www.3gpp.org/ftp/Meetings_3GPP_SYNC/RAN1/Docs/.

International Search Report and Written Opinion—PCT/US2018/030534—ISA/EPO—dated Aug. 17, 2018.

NTT Docomo: "Distributed Simple Parity Check Polar Codes", 3GPP Draft, R1-1705757, 3rd Generation Partnership Project (3GPP), Mobile Competence Centre, 650, Route Des Lucioles, F-06921 Sophia Antipolis Cedex, France vol. RAN WG1, No. Spokane, USA, Apr. 3, 2017-Apr. 7, 2017, Apr. 2, 2017 (Apr. 2, 2017), XP051243872, 6 Pages, Retrieved from the Internet: URL:http://www.3gpp.org/ftp/Meetings_3GPP_SYNC/RAN1/Docs/ [retrieved on Apr. 2, 2017].

* cited by examiner

FROZEN BITS BASED PRUNING AND EARLY TERMINATION FOR POLAR DECODING

CROSS REFERENCES

The present Application for Patent claims the benefit of U.S. Provisional Patent Application No. 62/502,154 by LIN, et al., entitled "FROZEN BITS BASED PRUNING AND EARLY TERMINATION FOR POLAR DECODING," filed May 5, 2017, which is assigned to the assignee hereof and expressly incorporated herein.

BACKGROUND

The following relates generally to wireless communication and more specifically to frozen bits based pruning and early termination for polar decoding.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting wireless communications for multiple communication devices, which may be otherwise known as user equipment (UE).

Wireless communications, however, often involves sending data over a noisy communication channel. To combat noise, a transmitter may encode data in the form of codewords using error correcting codes to introduce redundancy in the codewords so that transmission errors may be detected and/or corrected. Some examples of encoding algorithms with error correcting codes include convolutional codes (CCs), low-density parity-check (LDPC) codes, and polar codes. A polar code is an example of a linear block error correcting code and has been shown to approach the theoretical channel capacity as the code length approaches infinity. For decoding a codeword encoded using a polar code, a receiving device may make a candidate hypothesis of the code length and number of information bits, generate a representation of the information bits using a successive cancellation (SC) or successive cancellation list (SCL) decoding process on the codeword according to the candidate hypothesis, and perform an error checking operation on the representation of the information bits to determine if decoding was successful.

In some cases, the decoding operation may fail because the codeword has experienced excessive corruption (e.g., the codeword was transmitted via a channel with very low signal-to-noise ratio (SNR)), there is no transmitted codeword for the candidate hypothesis (e.g., the codeword represents random noise), the transmitted codeword is intended for a different device, or the candidate hypothesis may be incorrect (e.g., incorrect codeword size, incorrect information bit size, incorrect aggregation level). In some or all of these circumstances, terminating decoding for a candidate hypothesis early (e.g., prior to completion of all decoding processes) may limit power consumption in situations for which the decoding will be unsuccessful. However, differentiating circumstances in which early termination is appropriate (e.g., without terminating decoding early for some decoding processes that could have been successful) provides challenges for existing implementations. Other known techniques for facilitating early termination increase decoding complexity, decreasing the benefits provided by early termination.

SUMMARY

The described techniques relate to improved methods, systems, devices, or apparatuses that support frozen bits based pruning and early termination for polar decoding. The examples described herein include determining and using frozen bit metrics and frozen bit path metrics for pruning and early termination of candidate decoding paths. The candidate decoding paths may be evaluated for path selection at information bit locations according to decoding path metrics, while the frozen bit metrics or frozen bit path metrics may be employed at identified frozen bit locations of a polar code for pruning and early termination. The frozen bit path metric for a decoding path may be based on frozen bit metrics determined for the identified frozen bit locations along the decoding path.

Once the frozen bit path metrics and frozen bit metrics are determined, the decoder may compare these metrics to threshold criteria and determine whether to discard decoding paths based on the comparison. The techniques described herein for discarding decoding paths may allow the decoder to discard, prune, or disqualify certain decoding paths that are unlikely to provide an accurate representation of a possible candidate information bit vector associated with a received codeword. Consequently, the decoder may be able to increase detection probability by pruning paths unlikely to provide a correctly decoded set of information bits or save power by terminating a decoding process early (i.e., early termination) if all paths are discarded, pruned, or disqualified.

A method for wireless communication is described. The method may include receiving a candidate codeword via a communication channel, identifying a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits, performing a decoding process for the candidate codeword based at least in part on the identified decoding hypothesis, the decoding process comprising, for each frozen bit location of at least a subset of the plurality of frozen bit locations: determining frozen bit path metrics for a set of decoding paths based at least in part on bit metrics for the set of decoding paths for the each frozen bit location and preceding ones of the at least the subset of the plurality of frozen bit locations and independent of bit metrics for the plurality of information bit locations, and discarding a subset of the set of decoding paths based at least in part on comparisons of the frozen bit path metrics for each of the set of decoding paths to a threshold frozen bit path metric, and determining whether to process the information bits of the candidate codeword based at least in part on a result of the decoding process.

An apparatus for wireless communication is described. The apparatus may include means for receiving a candidate codeword via a communication channel, means for identifying a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits, means for performing a decoding process for the candidate codeword based at least in part on the identified decoding hypothesis, the means for performing the decoding process comprising, for each frozen bit location of at least a subset of the plurality of frozen bit locations: means for determining frozen bit path metrics for a set of decoding paths based at least in part on bit metrics for the set of decoding paths for the each frozen bit location and preceding ones of the at least the subset of the plurality of frozen bit locations and independent of bit metrics for the plurality of information bit locations, and means for discarding a subset of the set of decoding paths based at least in part on comparisons of the frozen bit path metrics for each of the set of decoding paths to a threshold frozen bit path metric, and means for determining whether to process the information bits of the candidate codeword based at least in part on a result of the decoding process.

Another apparatus for wireless communication is described. The apparatus may include a processor, memory in electronic communication with the processor, and instructions stored in the memory. The instructions may be operable to cause the processor to receive a candidate codeword via a communication channel, identify a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits, perform a decoding process for the candidate codeword based at least in part on the identified decoding hypothesis, the decoding process comprising, for each frozen bit location of at least a subset of the plurality of frozen bit locations: determining frozen bit path metrics for a set of decoding paths based at least in part on bit metrics for the set of decoding paths for the each frozen bit location and preceding ones of the at least the subset of the plurality of frozen bit locations and independent of bit metrics for the plurality of information bit locations, and discarding a subset of the set of decoding paths based at least in part on comparisons of the frozen bit path metrics for each of the set of decoding paths to a threshold frozen bit path metric, and determine whether to process the information bits of the candidate codeword based at least in part on a result of the decoding process.

A non-transitory computer readable medium for wireless communication is described. The non-transitory computer-readable medium may include instructions operable to cause a processor to receive a candidate codeword via a communication channel, identify a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits, perform a decoding process for the candidate codeword based at least in part on the identified decoding hypothesis, the decoding process comprising, for each frozen bit location of at least a subset of the plurality of frozen bit locations: determining frozen bit path metrics for a set of decoding paths based at least in part on bit metrics for the set of decoding paths for the each frozen bit location and preceding ones of the at least the subset of the plurality of frozen bit locations and independent of bit metrics for the plurality of information bit locations, and discarding a subset of the set of decoding paths based at least in part on comparisons of the frozen bit path metrics for each of the set of decoding paths to a threshold frozen bit path metric, and determine whether to process the information bits of the candidate codeword based at least in part on a result of the decoding process.

In some examples of the method, apparatus, and non-transitory computer-readable medium described above, the performing the decoding process further comprises, for the each frozen bit location, discarding a subset of the set of decoding paths based at least in part on comparisons of the bit metrics for the set of decoding paths for the each frozen bit location to a threshold bit metric. In some examples of the method, apparatus, and non-transitory computer-readable medium described above, the bit metrics for the set of decoding paths for the each frozen bit location may be based at least in part on reliability information for the each frozen bit location or an aggregate of logarithmic-likelihood ratio (LLR) magnitudes for the candidate codeword. In some examples of the method, apparatus, and non-transitory computer-readable medium described above, the determining frozen bit path metrics for the set of decoding paths further comprises determining the frozen bit path metrics based at least in part on a number of bit locations corresponding to the each frozen bit location and the preceding ones of the at least the subset of the plurality of frozen bit locations, reliability information for bit locations corresponding to the each frozen bit location and the preceding ones of the at least the subset of the plurality of frozen bit locations, or an aggregate of LLR magnitudes for the candidate codeword.

In some examples of the method, apparatus, and non-transitory computer-readable medium described above, for the each frozen bit location, the frozen bit path metrics may be determined based at least in part on a sum of the bit metrics for the each frozen bit location and the preceding ones of the at least the subset of the plurality of frozen bit locations. In some examples of the method, apparatus, and non-transitory computer-readable medium described above, the performing the decoding process further comprises, for the each frozen bit location, determining first candidate path metrics for each of the set of decoding paths that may be not discarded. In some examples of the method, apparatus, and non-transitory computer-readable medium described above, the performing the decoding process further comprises, for an information bit location following the each frozen bit location, determining second candidate path metrics for an extended set of decoding paths based at least in part on the first candidate path metrics and bit metrics for the information bit location. Some examples of the method, apparatus, and non-transitory computer-readable medium described above may further include processes, features, means, or instructions for selecting a subset of the extended set of decoding paths based at least in part on the second candidate path metrics.

In some examples of the method, apparatus, and non-transitory computer-readable medium described above, the determining whether to process the information bits comprises determining that all decoding paths of the set of decoding paths may be discarded and terminating decoding of the candidate codeword. In some examples of the method, apparatus, and non-transitory computer-readable medium described above, the determining whether to process the information bits comprises determining, subsequent to the decoding process for all of the plurality of frozen bit locations, that at least one decoding path of the set of decoding paths is not discarded, identifying the information bits based at least in part on the at least one decoding path, and processing the information bits based at least in part on the identification. In some examples of the method, apparatus, and non-transitory computer-readable medium described above, the subset of the plurality of frozen bit locations are selected for evaluation based at least in part on the decoding hypothesis or reliability information for the plurality of frozen bit locations.

A method for wireless communication is described. The method may include receiving a candidate codeword having a codeword length via a communication channel, identifying a decoding hypothesis for decoding the candidate codeword based at least in part on the candidate codeword being encoded using a polar code having a plurality of bit locations, the decoding hypothesis associated with a plurality of information bit locations of the polar code corresponding to a plurality of information bits and a plurality of frozen bit locations of the polar code corresponding to a plurality of frozen bits, initiating a decoding process for the candidate codeword, the decoding process being performed according to the codeword length and the decoding hypothesis, and determining whether to terminate the decoding process as having failed to obtain the plurality of information bits based at least in part on evaluating bit metric information associated with a subset of the plurality of bit locations, the subset of the plurality of bit locations selected from the plurality of frozen bit locations based at least in part on the decoding hypothesis.

An apparatus for wireless communication is described. The apparatus may include means for receiving a candidate codeword having a codeword length via a communication channel, means for identifying a decoding hypothesis for decoding the candidate codeword based at least in part on the candidate codeword being encoded using a polar code having a plurality of bit locations, the decoding hypothesis associated with a plurality of information bit locations of the polar code corresponding to a plurality of information bits and a plurality of frozen bit locations of the polar code corresponding to a plurality of frozen bits, means for initiating a decoding process for the candidate codeword, the decoding process being performed according to the codeword length and the decoding hypothesis, and means for determining whether to terminate the decoding process as having failed to obtain the plurality of information bits based at least in part on evaluating bit metric information associated with a subset of the plurality of bit locations, the subset of the plurality of bit locations selected from the plurality of frozen bit locations based at least in part on the decoding hypothesis.

Another apparatus for wireless communication is described. The apparatus may include a processor, memory in electronic communication with the processor, and instructions stored in the memory. The instructions may be operable to cause the processor to receive a candidate codeword having a codeword length via a communication channel, identify a decoding hypothesis for decoding the candidate codeword based at least in part on the candidate codeword being encoded using a polar code having a plurality of bit locations, the decoding hypothesis associated with a plurality of information bit locations of the polar code corresponding to a plurality of information bits and a plurality of frozen bit locations of the polar code corresponding to a plurality of frozen bits, initiate a decoding process for the candidate codeword, the decoding process being performed according to the codeword length and the decoding hypothesis, and determine whether to terminate the decoding process as having failed to obtain the plurality of information bits based at least in part on evaluating bit metric information associated with a subset of the plurality of bit locations, the subset of the plurality of bit locations selected from the plurality of frozen bit locations based at least in part on the decoding hypothesis.

A non-transitory computer readable medium for wireless communication is described. The non-transitory computer-readable medium may include instructions operable to cause a processor to receive a candidate codeword having a codeword length via a communication channel, identify a decoding hypothesis for decoding the candidate codeword based at least in part on the candidate codeword being encoded using a polar code having a plurality of bit locations, the decoding hypothesis associated with a plurality of information bit locations of the polar code corresponding to a plurality of information bits and a plurality of frozen bit locations of the polar code corresponding to a plurality of frozen bits, initiate a decoding process for the candidate codeword, the decoding process being performed according to the codeword length and the decoding hypothesis, and determine whether to terminate the decoding process as having failed to obtain the plurality of information bits based at least in part on evaluating bit metric information associated with a subset of the plurality of bit locations, the subset of the plurality of bit locations selected from the plurality of frozen bit locations based at least in part on the decoding hypothesis.

In some examples of the method, apparatus, and non-transitory computer-readable medium described above, the decoding process comprises successively decoding the plurality of bit locations. In some examples of the method, apparatus, and non-transitory computer-readable medium described above, the decoding process comprises a successive cancellation (SC) decoding process. In some examples of the method, apparatus, and non-transitory computer-readable medium described above, the decoding process comprises a successive cancellation list (SCL) decoding process.

A method for wireless communication is described. The method may include receiving a candidate codeword via a communication channel, identifying a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits, performing a decoding process for the candidate codeword based at least in part on the identified decoding hypothesis, the decoding process comprising, for each frozen bit location of at least a subset of the plurality of frozen bit locations: determining frozen bit path metrics for a set of decoding paths based at least in part on bit metrics for the set of decoding paths for the each frozen bit location and preceding ones of the at least the subset of the plurality of frozen bit locations and independent of bit metrics for the plurality of information bit locations, and discarding a subset of the set of decoding paths based at least in part on comparisons of the frozen bit path metrics for each of the set of decoding paths to a threshold frozen bit path metric, and determining whether to process the information bits of the candidate codeword based at least in part on a result of the decoding process.

An apparatus for wireless communication is described. The apparatus may include means for receiving a candidate codeword via a communication channel, means for identifying a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits, means for performing a decoding process for the candidate codeword based at least in part on the identified decoding hypothesis, the means for performing the decoding process comprising, for each frozen bit location of at least a subset of the plurality of frozen bit locations: means for determining frozen bit path metrics for a set of decoding paths based at least in part on bit metrics for the set of decoding paths for the each frozen bit location and preceding ones of the at least the subset of the plurality of frozen bit locations and independent of bit metrics for the plurality of information bit locations, and means for discarding a subset of the set of decoding paths based at least in part on comparisons of the frozen bit path metrics for each of the set of decoding paths to a threshold frozen bit path metric, and means for determining whether to process the information bits of the candidate codeword based at least in part on a result of the decoding process.

Another apparatus for wireless communication is described. The apparatus may include a processor, memory in electronic communication with the processor, and instructions stored in the memory. The instructions may be operable to cause the processor to receive a candidate codeword via a communication channel, identify a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits, perform a decoding process for the candidate codeword based at least in part on the identified decoding hypothesis, the decoding process comprising, for each frozen bit location of at least a subset of the plurality of frozen bit locations: determining frozen bit path metrics for a set of decoding paths based at least in part on bit metrics for the set of decoding paths for the each frozen bit location and preceding ones of the at least the subset of the plurality of frozen bit locations and independent of bit metrics for the plurality of information bit locations, and discarding a subset of the set of decoding paths based at least in part on comparisons of the frozen bit path metrics for each of the set of decoding paths to a threshold frozen bit path metric, and determine whether to process the information bits of the candidate codeword based at least in part on a result of the decoding process.

A non-transitory computer readable medium for wireless communication is described. The non-transitory computer-readable medium may include instructions operable to cause a processor to receive a candidate codeword via a communication channel, identify a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits, perform a decoding process for the candidate codeword based at least in part on the identified decoding hypothesis, the decoding process comprising, for each frozen bit location of at least a subset of the plurality of frozen bit locations: determining frozen bit path metrics for a set of decoding paths based at least in part on bit metrics for the set of decoding paths for the each frozen bit location and preceding ones of the at least the subset of the plurality of frozen bit locations and independent of bit metrics for the plurality of information bit locations, and discarding a subset of the set of decoding paths based at least in part on comparisons of the frozen bit path metrics for each of the set of decoding paths to a threshold frozen bit path metric, and determine whether to process the information bits of the candidate codeword based at least in part on a result of the decoding process.

In some examples of the method, apparatus, and non-transitory computer-readable medium described above, the performing the decoding process further comprises, for the each frozen bit location, discarding a subset of the set of decoding paths based at least in part on comparisons of the bit metrics for the set of decoding paths for the each frozen bit location to a threshold bit metric. In some examples of the method, apparatus, and non-transitory computer-readable medium described above, the bit metrics for the set of decoding paths for the each frozen bit location may be based at least in part on reliability information for the each frozen bit location or an aggregate of logarithmic-likelihood ratio (LLR) magnitudes for the candidate codeword. In some examples of the method, apparatus, and non-transitory computer-readable medium described above, the determining frozen bit path metrics for the set of decoding paths further comprises determining the frozen bit path metrics based at least in part on a number of bit locations corresponding to the each frozen bit location and the preceding ones of the at least the subset of the plurality of frozen bit locations, reliability information for the bit locations corresponding to the each frozen bit location and the preceding ones of the at least the subset of the plurality of frozen bit locations, or an aggregate of LLR magnitudes for the candidate codeword.

In some examples of the method, apparatus, and non-transitory computer-readable medium described above, for the each frozen bit location, the frozen bit path metrics may be determined based at least in part on a sum of the bit metrics for the each frozen bit location and the preceding ones of the at least the subset of the plurality of frozen bit locations. In some examples of the method, apparatus, and non-transitory computer-readable medium described above, the performing the decoding process further comprises, for the each frozen bit location, determining first candidate path metrics for each of the set of decoding paths that may be not discarded. In some examples of the method, apparatus, and non-transitory computer-readable medium described above, the performing the decoding process further comprises, for an information bit location following the each frozen bit location, determining second candidate path metrics for an extended set of decoding paths based at least in part on the first candidate path metrics and bit metrics for the information bit location. Some examples of the method, apparatus, and non-transitory computer-readable medium described above may further include processes, features, means, or instructions for selecting a subset of the extended set of decoding paths based at least in part on the second candidate path metrics.

In some examples of the method, apparatus, and non-transitory computer-readable medium described above, the determining whether to process the information bits comprises determining that all decoding paths of the set of decoding paths may be discarded and terminating decoding of the candidate codeword. In some examples of the method, apparatus, and non-transitory computer-readable medium described above, the determining whether to process the information bits comprises determining, subsequent to the decoding process for all of the plurality of frozen bit locations, that at least one decoding path of the set of decoding paths is not discarded, identifying the information bits based at least in part on the at least one decoding path, and processing the information bits based at least in part on the identification. In some examples of the method, apparatus, and non-transitory computer-readable medium described above, the subset of the plurality of frozen bit locations are selected for evaluation based at least in part on the decoding hypothesis or reliability information for the plurality of frozen bit locations.

A method for wireless communication is described. The method may include receiving a candidate codeword having a codeword length via a communication channel, identifying a decoding hypothesis for decoding the candidate codeword based at least in part on the candidate codeword being encoded using a polar code having a plurality of bit locations, the decoding hypothesis associated with a plurality of information bit locations of the polar code corresponding to a plurality of information bits and a plurality of frozen bit locations of the polar code corresponding to a plurality of frozen bits, initiating a decoding process for the candidate codeword, the decoding process being performed according to the codeword length and the decoding hypothesis, and determining whether to terminate the decoding process as having failed to obtain the plurality of information bits based at least in part on evaluating bit metric information associated with a subset of the plurality of bit locations, the subset of the plurality of bit locations selected from the plurality of frozen bit locations based at least in part on the decoding hypothesis.

An apparatus for wireless communication is described. The apparatus may include means for receiving a candidate codeword having a codeword length via a communication channel, means for identifying a decoding hypothesis for decoding the candidate codeword based at least in part on the candidate codeword being encoded using a polar code having a plurality of bit locations, the decoding hypothesis associated with a plurality of information bit locations of the polar code corresponding to a plurality of information bits and a plurality of frozen bit locations of the polar code corresponding to a plurality of frozen bits, means for initiating a decoding process for the candidate codeword, the decoding process being performed according to the codeword length and the decoding hypothesis, and means for determining whether to terminate the decoding process as having failed to obtain the plurality of information bits based at least in part on evaluating bit metric information associated with a subset of the plurality of bit locations, the subset of the plurality of bit locations selected from the plurality of frozen bit locations based at least in part on the decoding hypothesis.

Another apparatus for wireless communication is described. The apparatus may include a processor, memory in electronic communication with the processor, and instructions stored in the memory. The instructions may be operable to cause the processor to receive a candidate codeword having a codeword length via a communication channel, identify a decoding hypothesis for decoding the candidate codeword based at least in part on the candidate codeword being encoded using a polar code having a plurality of bit locations, the decoding hypothesis associated with a plurality of information bit locations of the polar code corresponding to a plurality of information bits and a plurality of frozen bit locations of the polar code corresponding to a plurality of frozen bits, initiate a decoding process for the candidate codeword, the decoding process being performed according to the codeword length and the decoding hypothesis, and determine whether to terminate the decoding process as having failed to obtain the plurality of information bits based at least in part on evaluating bit metric information associated with a subset of the plurality of bit locations, the subset of the plurality of bit locations selected from the plurality of frozen bit locations based at least in part on the decoding hypothesis.

A non-transitory computer readable medium for wireless communication is described. The non-transitory computer-readable medium may include instructions operable to cause a processor to receive a candidate codeword having a codeword length via a communication channel, identify a decoding hypothesis for decoding the candidate codeword based at least in part on the candidate codeword being encoded using a polar code having a plurality of bit locations, the decoding hypothesis associated with a plurality of information bit locations of the polar code corresponding to a plurality of information bits and a plurality of frozen bit locations of the polar code corresponding to a plurality of frozen bits, initiate a decoding process for the candidate codeword, the decoding process being performed according to the codeword length and the decoding hypothesis, and determine whether to terminate the decoding process as having failed to obtain the plurality of information bits based at least in part on evaluating bit metric information associated with a subset of the plurality of bit locations, the subset of the plurality of bit locations selected from the plurality of frozen bit locations based at least in part on the decoding hypothesis.

In some examples of the method, apparatus, and non-transitory computer-readable medium described above, the decoding process comprises successively decoding the plurality of bit locations. In some examples of the method, apparatus, and non-transitory computer-readable medium described above, the decoding process comprises a successive cancellation (SC) decoding process. In some examples of the method, apparatus, and non-transitory computer-readable medium described above, the decoding process comprises a successive cancellation list (SCL) decoding process.

DETAILED DESCRIPTION

Figure 1:
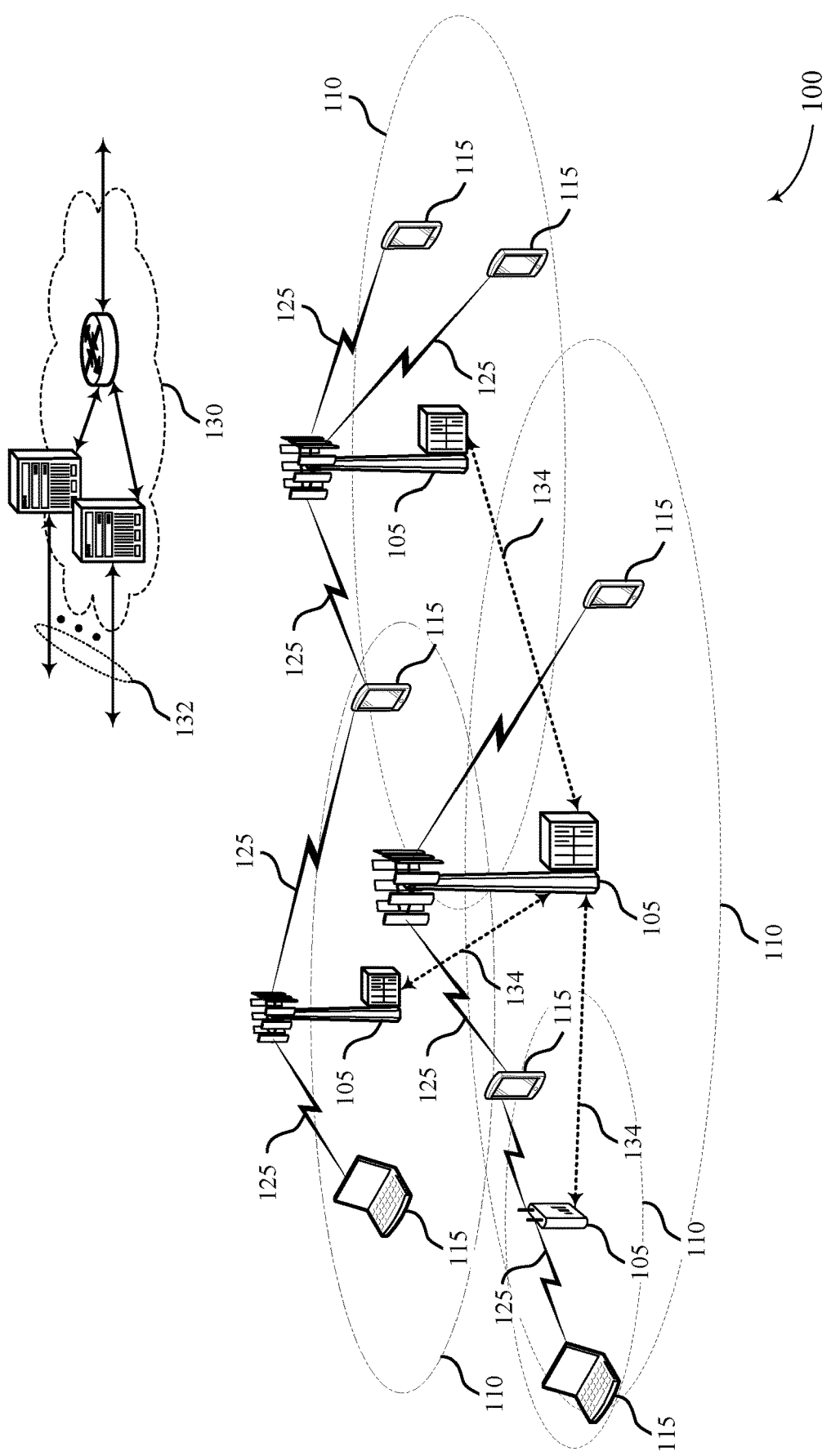
FIG. 1 illustrates an example of a wireless communications system that supports frozen bits based pruning and early termination for polar decoding in accordance with various aspects of the present disclosure.

The described techniques relate to improved methods, systems, devices, or apparatuses that support frozen bits based pruning and early termination for polar decoding. A polar code is an example of a linear block error correcting code and has been shown to approach the theoretical channel capacity as the code length approaches infinity. An encoder may receive an information vector including information bits for encoding, encode the information bits using a polar code to generate a codeword, and transmit the codeword via a wireless communication channel.

A decoder may receive the codeword and use a decoding process that attempts to retrieve the information bits from the codeword. In some cases, Successive Cancellation List (SCL) decoding may be used for decoding the codeword. In SCL decoding, a decoder may determine candidate paths through a code tree of sub-channels of a code and keep a list size L number of paths through the code tree at each decoding level. A candidate path may also be referred to herein as a decoding path.

In an example, during decoding, a candidate path may be extended at each sub-channel of a code tree through hard decision values of '0' or '1.' Extending L candidate paths by one additional bit results in 2L possible paths. In SCL decoding, a decoder may calculate a path metric for each candidate path and select L paths of the 2L possible paths having the best path metrics. A path metric may be a sum of costs for transitioning from bit value to bit value along a candidate path. Adding a bit having a particular value to a candidate path may be associated with a cost representing the probability of the bit value being correct.

In some cases, a device may receive a corrupted transmission, and it may be appropriate for the device to terminate a decoding process early (i.e., early termination). To facilitate early termination, an encoder may append additional bits (e.g., cyclic redundancy check (CRC) bits or parity check bits) in the form of an outer code to a codeword transmitted to a decoder. The decoder may then compare these bits to calculated values to determine whether to keep a particular decoding path. Accordingly, if the decoder determines to discard all decoding paths, the decoder may save power by terminating decoding early.

However, in some cases, the use of these additional bits may increase decoding complexity at a decoder. For example, the decoder may perform operations on these bits regarding the decoding bit hypothesis and operations in list management and bit feedback for these bits, which may increase complexity. Further, these additional bits may be distributed throughout a bit sequence rather than being collocated at one location of the code. As a result, a decoder may perform, for example, distributed CRC or parity derivation in order to achieve early termination, which may increase processing latencies during run-time decoding. Thus, techniques for utilizing additional bits to facilitate early termination at a decoder may be inefficient.

As described herein, a decoder may support efficient techniques for supporting early termination to limit decoding complexity, latency, and power consumption at a device. A polar code may be composed of multiple sub-channels having different levels of reliability. Sub-channel reliability may represent a capacity of the sub-channel to carry information as part of the encoded codeword. Sub-channels of a polar code having higher reliabilities are used to encode information bits and the remaining sub-channels are used to encode frozen bits. For N sub-channels, K information bits may be loaded into the K most reliable sub-channels and N-K frozen bits may be loaded into the N-K least reliable sub-channels, where K<N.

A frozen bit is a bit having a known value to a decoder and is generally set as '0'. The value of a frozen bit, however, may be any value as long as the decoder knows or can calculate the value of the frozen bit from information bits previously received (e.g., bits decoded earlier based on a decoding order of the codeword). The techniques described herein allow a decoder to support early termination using the known value of frozen bits. Specifically, a decoder may determine frozen bit path metrics and frozen bit metrics, and the decoder may determine whether to discard a decoding path based on comparing these metrics to threshold criteria. If one or more of these metrics do meet the threshold criteria for pruning a decoding path, the decoder may determine to discard the decoding path. Accordingly, the decoder may be able to support early termination without necessitating additional CRC or parity bits in a polar code.

Aspects of the disclosure introduced above are described below in the context of a wireless communications system. Examples of processes and signaling exchanges that support frozen bits based pruning and early termination for polar decoding are then described. Aspects of the disclosure are further illustrated by and described with reference to apparatus diagrams, system diagrams, and flowcharts that relate to frozen bits based pruning and early termination for polar decoding.

FIG. 1 illustrates an example of a wireless communications system 100 that supports frozen bits based pruning and early termination in accordance with various aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-Advanced Pro network, or a New Radio (NR) network. In some cases, wireless communications system 100 may support enhanced broadband communications, ultra-reliable (i.e., mission critical) communications, low latency communications, and communications with low-cost and low-complexity devices.

Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105 or downlink transmissions from a base station 105 to a UE 115.

Control information and data may be multiplexed on an uplink channel or a downlink channel according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) on a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, a vehicle, or the like.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

In wireless communications system 100, base stations 105 and UEs 115 may communicate over noisy communication channels. To combat noise, a transmitter may encode codewords using error correcting codes to introduce redundancy in the codewords so that transmission errors may be detected and corrected. Some examples of encoding algorithms with error correcting codes include convolutional codes (CCs), low-density parity-check (LDPC) codes, and polar codes. In some cases, a receiving device may be attempting to decode a corrupted transmission (e.g., a corrupted polar-encoded codeword), a candidate transmission that is not present, or a candidate transmission that is intended for a different device. In some or all of these circumstances, terminating decoding early (e.g., prior to completion of all decoding processes) may limit power consumption in situations for which the decoding will be unsuccessful. However, existing implementations that facilitate early termination may increase decoding complexity which limits the benefits of pruning and early termination.

Wireless communications system 100 may support efficient decoding techniques for supporting early termination to limit decoding complexity, latency, and power consumption at a device. The techniques described herein allow a decoder to support early termination using the known value of frozen bits. Specifically, a decoder may determine frozen bit metrics or frozen bit path metrics at frozen bit locations of a polar code, and the decoder may determine whether to discard a decoding path based on comparing these metrics to threshold criteria. If one or more of these metrics meet the threshold criteria for pruning a decoding path, the decoder may determine to discard the decoding path.

Figure 2:
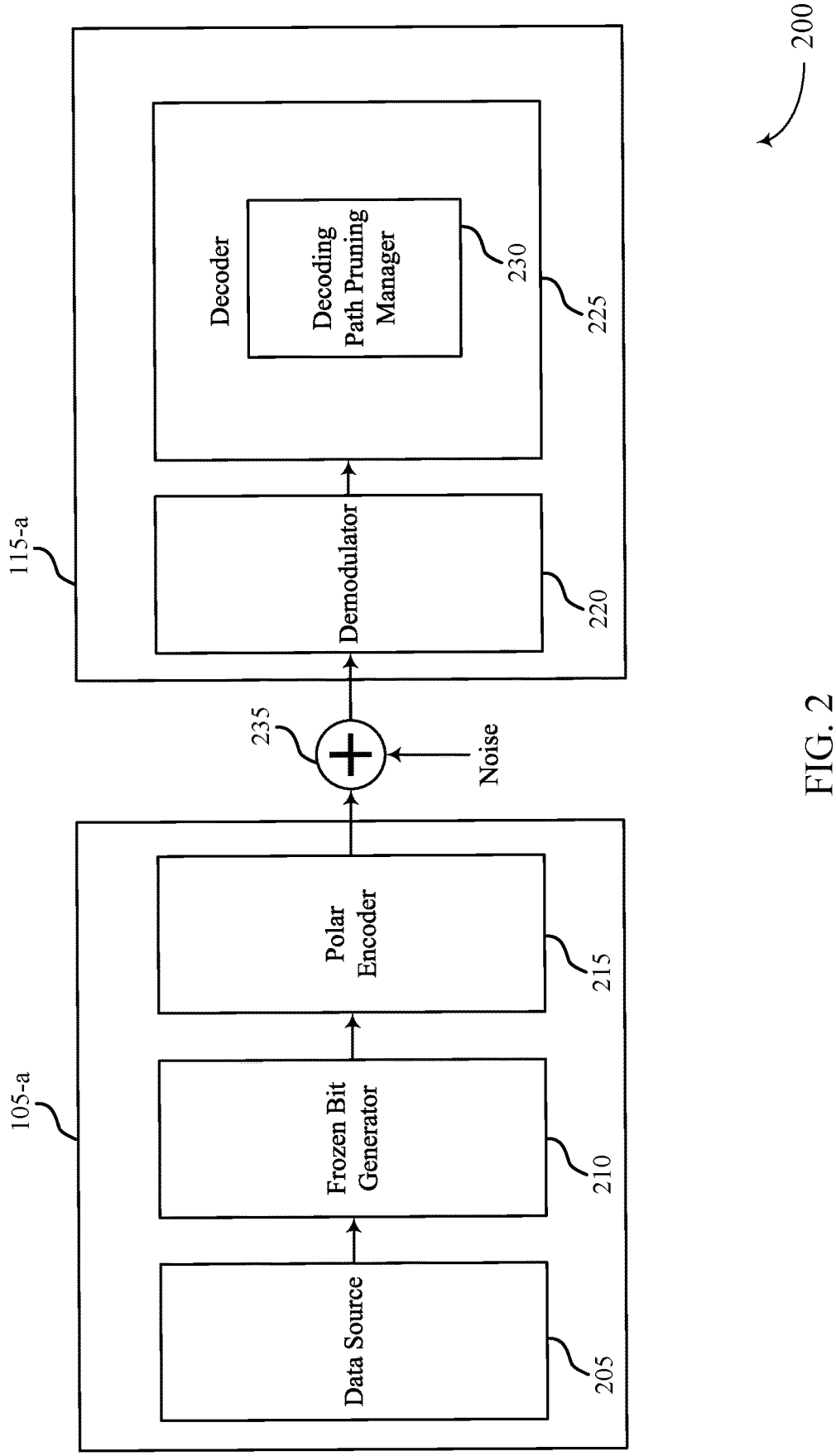
FIG. 2 illustrates an example of a wireless communications system that supports frozen bits based pruning and early termination for polar decoding in accordance with various aspects of the present disclosure.

FIG. 2 illustrates an example of a wireless communications system 200 that supports frozen bits based pruning and early termination for polar decoding in accordance with various aspects of the present disclosure. Wireless communications system 200 may implement aspects of wireless communications system 100. Wireless communications system 200 includes a base station 105-a and a UE 115-a. Base station 105-a is an example of a base station 105 of FIG. 1, and UE 115-a is an example of a UE 115 of FIG. 1.

In the example of FIG. 2, base station 105-a may use polar encoding to encode information bits for transmission to UE 115-a via a communication channel 235. In other examples, UE 115-a may encode data for transmission to base station 105-a or another UE 115 using these same techniques. In further examples, base station 105-a may encode data for transmission to another base station 105 using these same techniques. Moreover, devices other than base station 105-a and UE 115-a may use the techniques described herein for decoding a codeword encoded using a polar code.

In the depicted example, base station 105-a may include a data source 205, a frozen bit generator 210, and a polar encoder 215. The data source 205 may provide an information vector of k information bits to be encoded and transmitted to the UE 115-a. The data source 205 may be coupled to a network, a storage device, or the like. The data source 205 may output the information vector to the frozen bit generator 210. Frozen bit generator 210 may generate frozen bits for a polar code used to encode a codeword to be transmitted to UE 115-a (e.g., based on the information bits or independent of the information bits). Frozen bit generator 210 may pass the generated frozen bits to polar encoder 215 which may encode the information bits and frozen bits to obtain a codeword for transmission to UE 115-a. As mentioned above, polar encoder 215 may allocate the most reliable sub-channels of a polar code to information bits and the least reliable sub-channels of the polar code to frozen bits.

Figure 3:
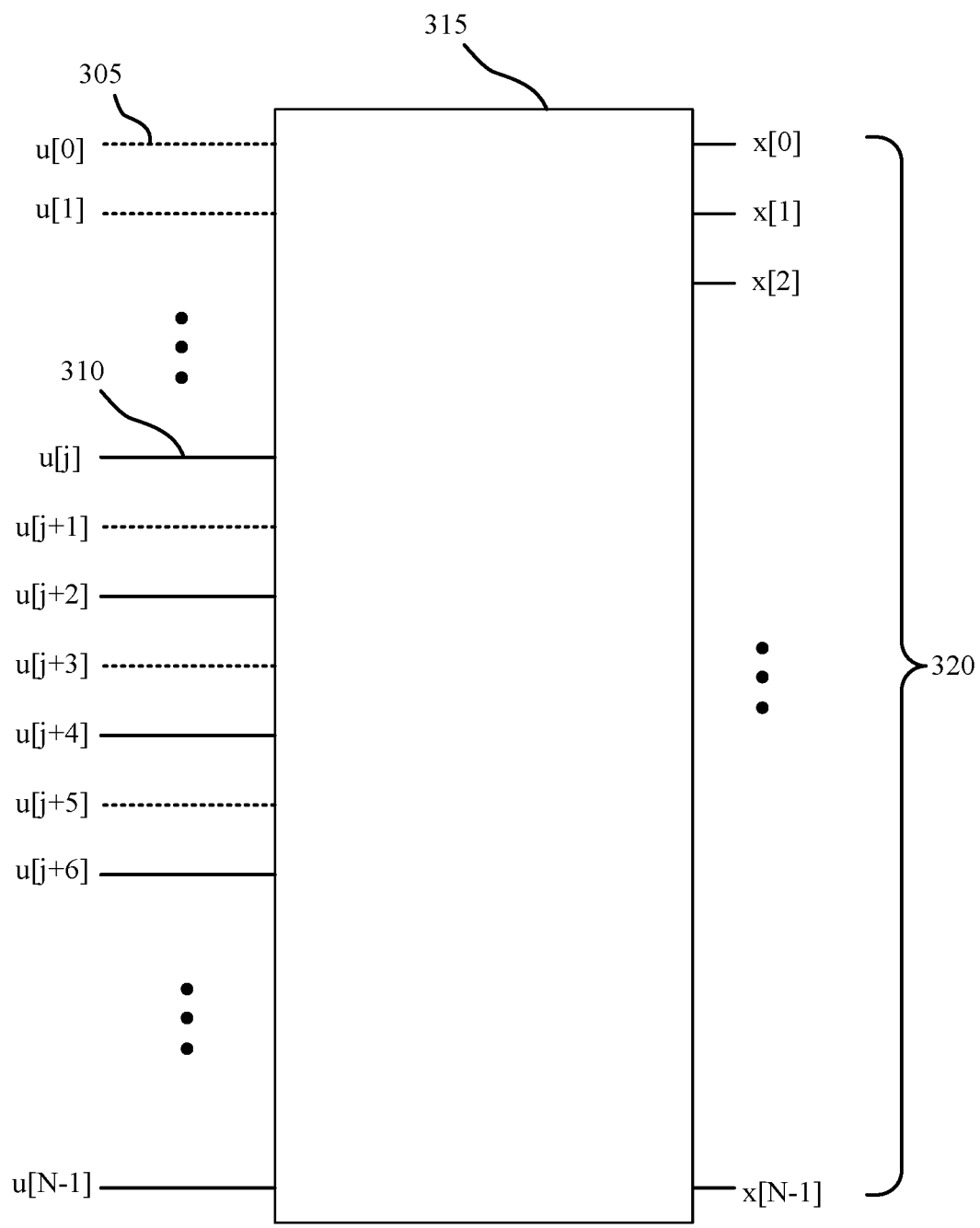
FIG. 3 illustrates an example diagram of sub-channels of a polar code in accordance with various aspects of the present disclosure.

FIG. 3 illustrates an example diagram 300 of a polar code in accordance with various aspects of the present disclosure. Diagram 300 depicts a polar code for encoding or decoding a codeword 320 that includes N sub-channels in a decoding order with sub-channel 0 on top, followed by sub-channel 1, and proceeding sequentially to sub-channel N−1. The decoding order may indicate which sub-channels include information bits and which sub-channels include frozen bits and may correspond to the order in which the decoder 225 decodes sub-channels of a polar code. Polar encoder 215 and decoder 225 may determine the decoding order or otherwise be aware of the decoding order (e.g., access a table in memory that includes the decoding order).

Generator matrix 315 may be used by an encoder (e.g., polar encoder 215) to encode frozen bits and information bits input to sub-channels u[0:N−1] to generate codeword sub-channels x[0:N−1], and may be used by a decoder to decode information received on codeword sub-channels x[0:N−1] to obtain a representation of the information bits and frozen bits on sub-channels u[0:N−1]. Sub-channels 305 corresponding to frozen bits are depicted using dashed lines, and sub-channels 310 corresponding to information bits are depicted using solid lines. The depicted location of the sub-channels within the decoding order is an example and the location of any particular sub-channel may depend on its reliability relative to other sub-channels of the polar code.

After encoding, polar encoder 215 may pass the encoded bits to a rate-matcher (not shown) to rate-match the encoded bits to a set of resources for the transmission to UE 115-*a*. When rate-matching is employed, a subset of the N bits may be transmitted or a subset of the N bits may be repeated in the transmission. In some examples, sub-channel reliability is computed for each M:N:K combination, where M is the number of the N bits of the codeword that are transmitted, and M may be less than (puncturing) or greater than (repetition) N. The rate matcher may then input the rate-matched bits to a modulator (not shown) for modulation prior to the transmission to UE 115-*a*. Base station 105-*a* may then transmit the codeword to UE 115-*a* over communication channel 235.

UE 115-*a* may identify a candidate codeword based on a candidate hypothesis (e.g., decoded resources, M:N:K hypothesis). For example, the UE 115-*a* may employ a blind decoding process in which multiple candidate hypotheses (i.e., decoding hypotheses) within a search space are tested to determine if decoding performed for any of the candidate hypotheses is successful. Demodulator 220 may demodulate the candidate codeword, which may include demapping received symbols associated with a set of resources to obtain a representation of the codeword. Demodulator 220 may then pass the representation of the codeword to decoder 225 to identify the most likely candidate path or paths for the information bits obtained from the codeword. The demodulated signal may be, for example, a sequence of logarithmic-likelihood ratio (LLR) values representing a probability value of a received bit being a '0' or a '1.' The decoder may perform a list decoding algorithm on the LLR values (e.g., SCL decoding) and may provide an output. If the decoder is able to decode the polar-encoded codeword successfully, the decoder may output a bit sequence of the information vector (e.g., the k information bits) for use, storage, communication to another device, or the like.

Figure 4:
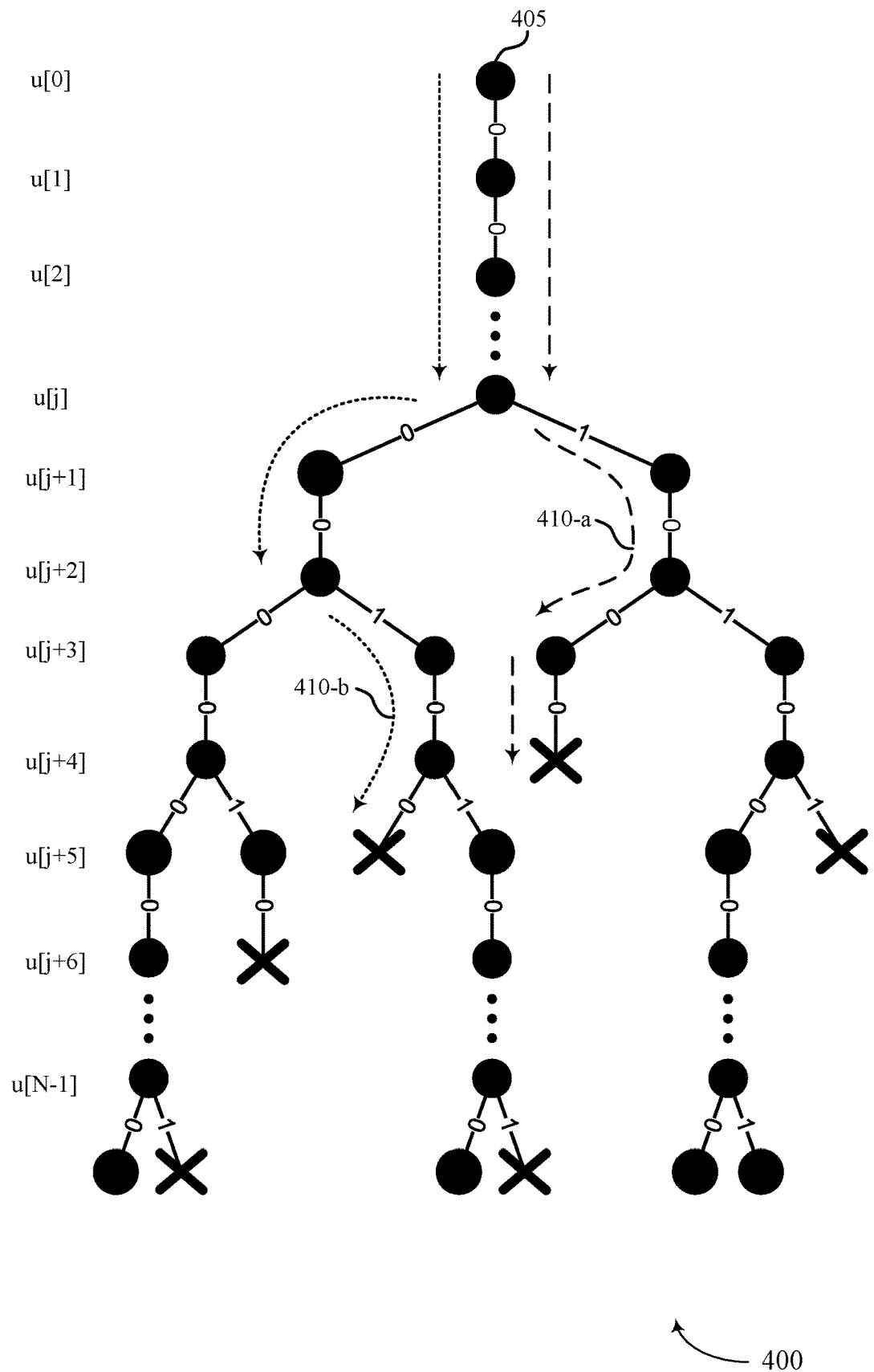
FIG. 4 illustrates an example of multiple decoding paths in a decoding process in accordance with various aspects of the present disclosure.

According to various aspects described herein, decoder 225 may support decoding techniques that facilitate early termination while limiting the complexity of the decoding process. Specifically, the decoder may determine decoding paths corresponding to a sequence of bits, and the decoder may discard decoding paths that are unlikely to accurately represent information bits transmitted by the base station 105-*a* in an encoded codeword. FIG. 4 illustrates an example of multiple decoding paths 400 maintained by a decoder during a decoding process in accordance with various aspects of the present disclosure. Decoder 225 may maintain the decoding paths that are likely to accurately represent information bits received from base station 105-*a*. The levels of the decoding process illustrated in FIGS. 3 and 4 are used to show the relationship between the information and frozen bit locations of FIG. 3 and the decoding paths of FIG. 4.

Upon receiving the polar-encoded codeword, UE 115-*a* may generate the decoding paths 400 to identify the information bits included in the codeword. Decoding paths 400 depicts list decoding for sub-channels j to j+6 as illustrated in FIG. 3. In some examples, sub-channel j is the location of the first information bit in the decoding order of the polar code. However, it should be understood that the operations depicted in FIG. 4 may be carried out at various sections of the sub-channels of the polar code. Prior to sub-channel j, the decoder 225 may maintain only one decoding path because all preceding sub-channels are frozen bits which the decoder knows have a value of '0.'

At sub-channel j, decoder 225 may split the decoding path from a node 405 associated with an information bit location of FIG. 3 into two decoding paths for the two possible values for the information bit. In some cases, decoder 225 may limit a number of decoding paths maintained during the decoding process (e.g., may maintain a maximum of L decoding paths after SCL operations for each sub-channel). In the example of FIG. 4, the decoder 225 may maintain a maximum of four (4) paths (i.e., L=4). Accordingly, since the number of paths after processing sub-channel j in FIG. 4 is below four (4) (i.e., two (2)), the decoder 225 may continue the list decoding process without discarding any of these decoding paths.

Although the decoder 225 may not have to select a number of paths to continue processing, the decoder 225 may determine path metrics for each decoding path based on the probability that the information bit is a '0' or '1' for each decoding path. The decoder may maintain these path metrics as it traverses through the code tree, updating the path metrics for each of the L decoding paths for each sub-channel (e.g., frozen bits and information bits) based on bit metrics calculated for each sub-channel for each decoding path. When the number of decoding paths exceeds the list size due to decoding branches at information bit locations, the decoder 225 may select the L best decoding paths based on the path metrics for continued processing.

At sub-channel j+1, decoder 225 may identify a frozen bit location, and the value of the frozen bit may be known in advance to be '0.' Decoder 225 may then generate a frozen bit metric associated with the frozen bit at sub-channel j+1 based on the probability that the value of the frozen bit is '0.' In some examples, the probability that the value of the frozen bit is '0' may depend on an LLR associated with a sub-channel allocated to the frozen bit. Using the frozen bit metric, decoder 225 may then generate frozen bit path metrics for each of the decoding paths. For example, the frozen bit metrics generated at sub-channel j+1 may be different for decoding paths 410-*a* and 410-*b*, and the frozen bit path metrics for each of the decoding paths may depend on the respective frozen bit metrics. In some cases, the frozen bit metrics and frozen bit path metrics may not depend on all frozen bit locations of a polar code. Instead, the frozen bit metrics and frozen bit path metrics may depend on a subset of the frozen bit locations of a polar code. That is, a subset of the frozen bit locations of a polar code may be evaluated for early termination.

In one example, the subset of frozen bit locations to be evaluated may be selected based on reliability information associated with each frozen bit location of the frozen bits. For instance, the frozen bit locations associated with the highest reliabilities (e.g., above a reliability threshold) may be selected for evaluation. In another example, the subset of frozen bit locations to be evaluated may be selected based on a decoding hypothesis identified for decoding. Because the number of information bits for different codewords (e.g., different messages having different downlink control information (DCI) message formats) may be different, the frozen bit locations of a first codeword may correspond to information bit locations of a second codeword. As such, for a decoding hypothesis corresponding to the first codeword, the decoder may evaluate the frozen bit locations of the first codeword that correspond to information bit locations of the second codeword such that the decoder may be able to differentiate between the first and second codewords.

Once the frozen bit metric or frozen bit path metrics are determined, the decoder 225 may determine whether to discard certain decoding paths based on frozen bit criteria for path pruning. Specifically, decoder 225 may compare the frozen bit metrics to a threshold frozen bit metric and, if the result of the comparison meets the criteria for pruning (e.g., the frozen bit metric is greater than the threshold frozen bit metric where lower metrics are associated with greater decoding certainty), decoding path pruning manager 230 may discard (or prune) the decoding path associated with the frozen bit metric. Similarly, decoder 225 may compare the frozen bit path metrics to a threshold frozen bit path metric, and, if the frozen bit path metric for a given decoding path meets the frozen bit path criteria for path pruning (e.g., the frozen bit path metric is greater than a threshold frozen bit path metric where lower metrics are associated with greater decoding certainty), decoding path pruning manager 230 may discard (or prune) the decoding path associated with the frozen bit path metric.

In the example of FIG. 4, decoder 225 may determine that the frozen bit metrics and frozen bit path metrics for each of the decoding paths at sub-channel j+1 fail to meet the criteria for pruning, and decoder 225 may thus determine to maintain both of these decoding paths. At sub-channel j+2, decoder 225 may split each of the decoding paths into two (2) decoding paths to generate four (4) decoding paths. Since the number of paths after processing sub-channel j+2 in FIG. 4 is less than or equal to the list size of four (4), the decoder 225 may continue the list decoding process without discarding any of these decoding paths. Subsequently, at sub-channel j+3, decoder 225 may determine that the metrics for decoding path 410-*a* indicate that the path is unlikely to accurately represent the information bits received from base station 105-*a*, and decoder 225 may discard (or prune) decoding path 410-*a*. For example, decoder 225 may determine that either the frozen bit metric or the frozen bit path metric for decoding path 410-*a* at sub-channel j+3 of the decoding process meets the criteria for path pruning (e.g., greater than a threshold), and the decoder 225 may therefore determine to discard (or prune) decoding path 410-*a*.

At sub-channel j+4, decoder 225 may extend the remaining decoding paths, and, determine that the number of decoding paths generated (i.e., six (6) decoding paths) is greater than L (i.e., four (4)). Accordingly, decoder 225 may select four (4) of the six (6) decoding paths to maintain. The decoding paths at sub-channel j+4 may be selected based on candidate path metrics associated with each of the decoding paths (e.g., decoding path 410-*b* may not be selected). As discussed above, the candidate path metric for a decoding path may be generated based on information bit metrics and frozen bit metrics determined along the decoding path. In contrast, the frozen bit path metrics may be generated based on frozen bit metrics determined along a decoding path and, while dependent on the hard bits for each decoding path for previous bit locations via bit feedback operations according to the polar code, the frozen bit path metrics may be independent of bit metrics determined for information bit sub-channels along the decoding path. In other words, the frozen bit path metrics may be generated based on an accumulation of frozen bit metrics determined along the decoding path for at least a subset of frozen bit locations (i.e., for a current frozen bit location and at least a subset of preceding frozen bit locations on the decoding path) but exclusive of bit metrics for the information bit locations along the decoding path. Further, the candidate path metrics, determined based on information and frozen bit metrics, are used for path selection (e.g., at information bit locations), whereas the frozen bit metrics and frozen bit path metrics, determined independently of bit metrics of information bits, are used to determine whether to discard (or prune) decoding paths (e.g., at frozen bit locations). Although FIG. 4 describes that paths meeting the criteria for pruning are discarded in the list decoding process, decoder 225 may maintain all paths at each frozen bit location, but mark paths that meet the criteria for pruning as erroneous. Thus, decoder 225 may continue to maintain the candidate paths with the highest candidate path metrics until all decoding paths meet the criteria for pruning. Not discarding intermediate paths may reduce false alarm rate.

In some decoding operations, all the remaining decoding paths may meet the criteria for pruning at a particular level and may be discarded (or pruned), and the decoder 225 may terminate a decoding process early to limit power consumption at UE 115-*a*. In other decoding operations using a different input codeword or different N:K values, at least one decoding path may make it through frozen bit metric and/or frozen path metric evaluation for all evaluated frozen bit locations. Decoder 225 may then identify candidate sets of information bits for the codeword received from base station 105-*a* based on the remaining decoding paths (e.g., up to four (4) decoding paths in the example of FIG. 4). Specifically, the number of bits of a decoding path may include CRC bits and information bits, and decoder 225 may check the CRC bits to identify if one of the candidate sets of information bits passes the CRC check to be considered a successfully decoded set of information bits for processing of the information.

Figure 5:
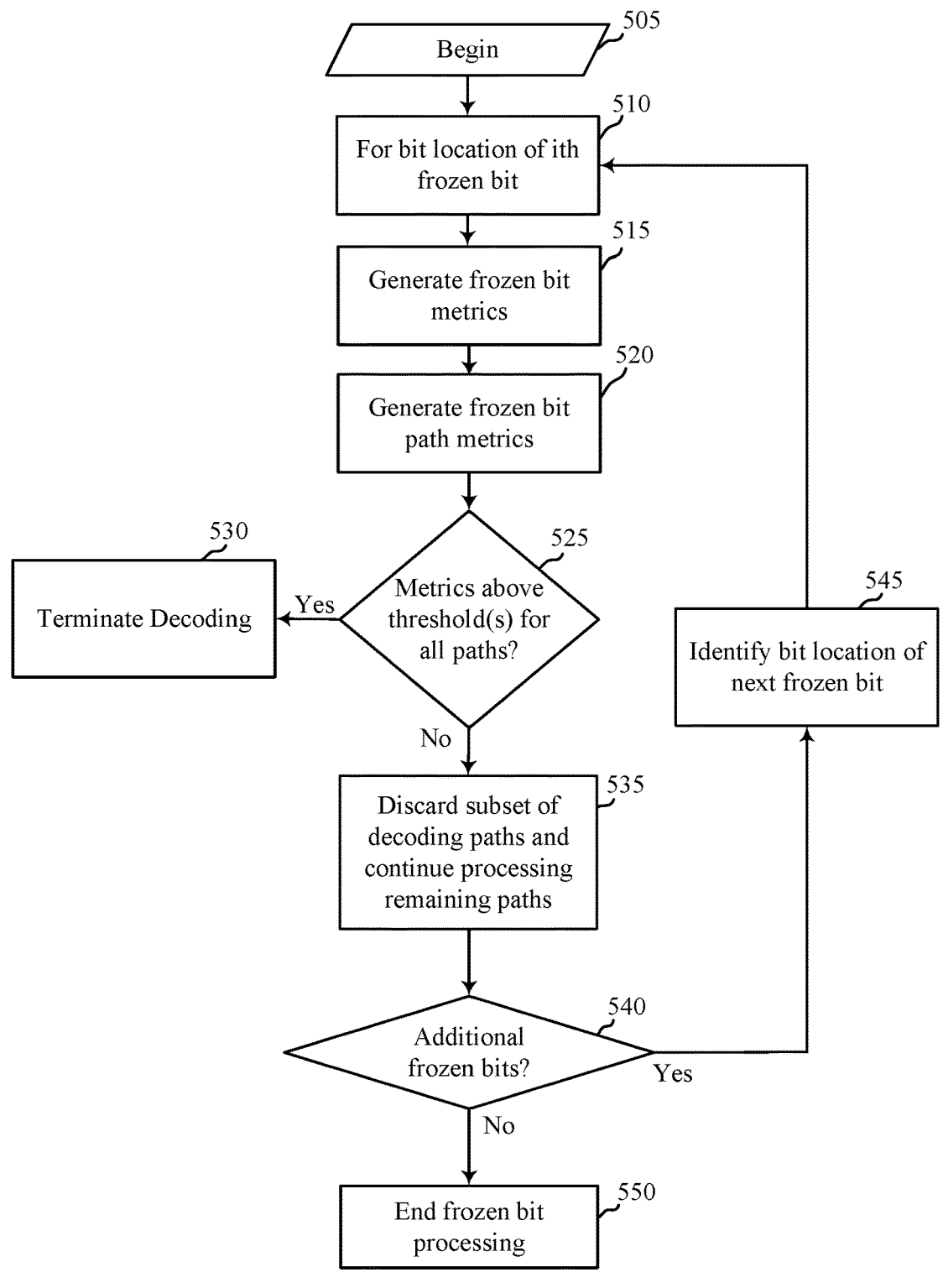
FIG. 5 illustrates an example of a flow diagram that supports frozen bits based pruning and early termination for polar decoding in accordance with various aspects of the present disclosure.

FIG. 5 illustrates an example of a flow diagram 500 that supports frozen bits based pruning and early termination for polar decoding in accordance with various aspects of the present disclosure. Flow diagram 500 illustrates the processing of frozen bit locations of a polar code that may allow a decoder to determine whether to discard (or prune) certain decoding paths. In some aspects, the flow diagram 500 may be used by a UE 115-*a* in blind decoding (e.g., of control information). For example, decoder 225 may determine to test multiple N:K hypothesis as part of a blind decoding process, and flow diagram 500 may be repeated for each N:K hypothesis.

In some cases, the N–K frozen bits may be indexed according to a pre-encoding bit ranking with the index i, where $$i \in \{0, 1, \ldots, N-K-1\} \quad (1)$$

As described with reference to FIG. 4, decoder 225 may generate frozen bit metrics for each of the indexed frozen bits. Decoder 225 may also generate frozen bit path metrics using the frozen bit metrics for each of the indexed frozen bits of a vector of frozen bits (I), where $$I \subset \{0, 1, \ldots, N-K-1\} \quad (2)$$

In some cases, the decoding techniques described herein may be applied to a subset of frozen bit locations rather than to all frozen bit locations (e.g., a vector of frozen bits (I) whose length is less than N–K). Additionally, the L decoding candidates may be indexed with the index j, where $$j \in \{0, 1, \ldots, L-1\} \quad (3)$$

The above indices are used to identify a specific frozen bit metric or frozen bit path metric of a decoding path that is used to determine whether to discard (or prune) a decoding path.

Flow diagram 500 begins at 505 and proceeds to block 510. At block 510, UE 115-*a* may identify a frozen bit location (e.g., an ith frozen bit location). At block 515, UE 115-*a* may generate frozen bit metrics ($F_{i,j}$) for one or more decoding paths based on the frozen bit location. As an example, decoder 225 may determine a conditional probability ($P_{f\_i,j}$) that the frozen bit at the frozen bit location for a path candidate j is equal to '0' (i.e., f_i=0) since the bit is frozen (e.g., known to be equal to '0'). Decoder 225 may then determine the frozen bit metric based on the conditional probability ($P_{f\_i,j}$) associated with the frozen bit. Specifically, decoder 225 may determine the frozen bit metric based on the following:

$$F_{i,j} \triangleq 0, \text{ if } P_{f_i,j} \geq 0, \text{ or}$$

$$F_{i,j} \triangleq 0|P_{f_i,j}|, \text{ if } P_{f_i,j} < 0 \quad (4)$$

Subsequently, at block 520, decoder 225 may determine the frozen bit path metric ($F_{I,j}$) over a sequence of frozen bits. For example, for a decoding path, the frozen bit path metric may be determined based on the frozen bit metric for the ith frozen bit and the frozen bit metrics for frozen bits preceding the ith frozen bit. In some examples, decoder 225 may evaluate the frozen bit path metrics for a first subset of frozen bit locations (e.g., frozen bit location vector I), while the frozen bit path metrics are determined based on a second subset of frozen bit locations (locations in the second subset preceding the ith frozen bit location). That is, the bit locations for frozen bit path metric evaluation need not be the same as the bit locations used for calculating the frozen bit path metrics. Specifically, decoder 225 may determine the frozen bit path metric based on the following equation (e.g., for all frozen bits up to and including the ith frozen bit):

$$F_{I,j} \triangleq \Sigma_{i \in I}(F_{i,j}), \text{ where } I \subset \{0,1, \ldots, N-K-(N-i)-1\} \text{ and } j \subset \{0,1, \ldots, L-1\} \quad (5)$$

Once the frozen bit metric and the frozen path metric for a decoding path is determined for the ith frozen bit, decoder 225 may compare one or more metrics to threshold criteria to determine whether to discard (or prune) the decoding path. That is, if, at block 525, decoder 225 determines that either the frozen bit metrics or frozen path metrics for all decoding paths meet the respective threshold criteria for pruning, decoder 225 may discard (or prune) all decoding paths and terminate decoding early (i.e., early termination at block 530). Otherwise, at block 535, decoder 225 may discard a subset of the decoding paths whose metrics meet the respective threshold criteria, and decoder 225 may continue processing the remaining decoding paths. Alternatively, decoder 225 may not discard any decoding paths unless all decoding paths meet the threshold criteria for pruning, or may mark pruned decoding paths but continue to extend the marked paths according to the candidate path metrics. Thus, at 525, decoder 225 may terminate decoding early if all decoding paths either meet the threshold criteria for pruning, or are marked as having previously failed the criteria. As described above, although equation 1 describes a scenario of using all frozen bit locations for calculating frozen bit path metrics, only a subset may be used, in some cases. The subset may be determined according to, for example, the frozen bit locations having the highest reliability (e.g., highest polarization weight) or the highest generator weight (number of "G" operations for a given sub-channel). Additionally or alternatively, the frozen bit path metrics may only be evaluated against the threshold criteria for path pruning at a subset (which may be the same as or a subset of the subset used for determining the frozen bit path metrics) of the frozen bit locations. The subset may be selected based at least in part on the decoding hypothesis or reliability information for the plurality of frozen bit locations.

In some cases, decoder 225 may normalize the frozen bit metric or frozen bit path metric values before comparing these values to the respective thresholds. In particular, the thresholds used for comparison of the frozen bit metrics or frozen bit path metrics may be the same for all evaluated frozen bit locations while decoder 225 may normalize the frozen bit metrics or frozen bit path metrics based on one or more factors. In one example, decoder 225 may normalize frozen bit metrics based on a predefined scalar array of size N–K, where each value in the array is used to normalize a frozen bit metric or frozen path metric calculated at a corresponding frozen bit location. In some cases, each value in the scalar array corresponding to a frozen bit location may depend on reliability information for the frozen bit location. Thus, decoder 225 may normalize the frozen bit metrics based on reliability information for each frozen bit location of the polar code and the normalization may be based on the values of N and K. The reliability information may be, for example, polarization weight, generator weight, or the like.

In another example, decoder 225 may normalize frozen bit metrics or frozen bit path metrics based on an aggregate of LLR magnitudes for the received polar-encoded codeword. In yet another example, decoder 225 may normalize frozen bit path metrics based on a number of frozen bit locations used for generation of the frozen bit path metrics (e.g., including an evaluated frozen bit location and preceding frozen bit locations used for generation of the frozen bit path metrics). That is, the normalization may account for the accumulation of frozen bit metrics as frozen bit path metrics are updated for each frozen bit location in the vector I. Further, frozen bit metrics or frozen bit path metrics may be normalized based on a combination of the above factors.

At block 540, decoder 225 may determine if there are additional frozen bits remaining in a polar code, and, if there are remaining frozen bits, decoder 225 may identify the bit location of the next frozen bit at block 545, and repeat the procedures described above starting at block 510. If there are no more frozen bits in the polar code, decoder 225 may end the frozen bit processing at block 550. The techniques described herein may allow decoder 225 to terminate a decoding procedure early if a corrupted transmission is received or if a device receives pure noise.

Figure 6:
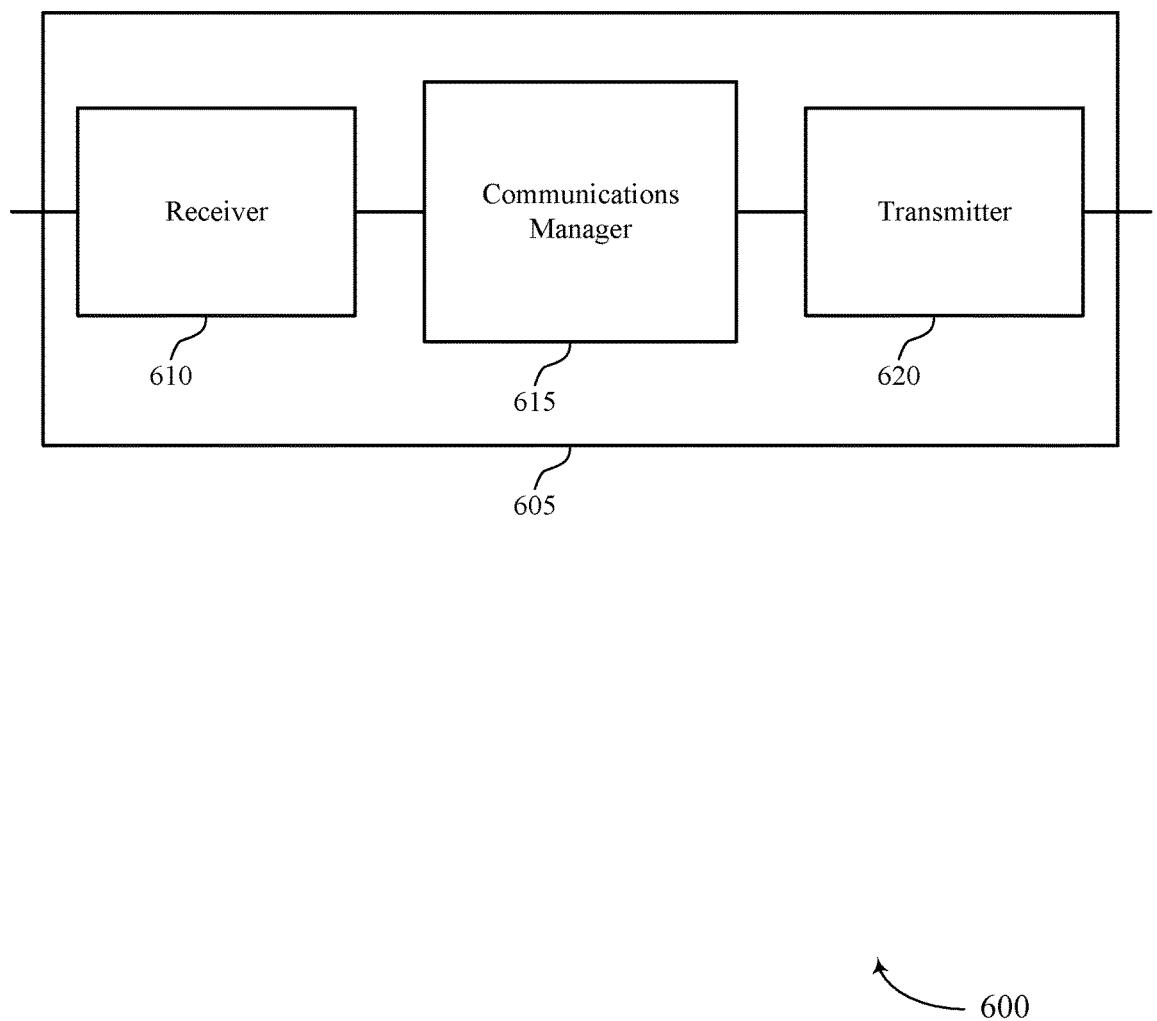
FIGS. 6-8 show block diagrams of a device that supports frozen bits based pruning and early termination for polar decoding in accordance with various aspects of the present disclosure.

FIG. 6 shows a block diagram 600 of a wireless device 605 that supports frozen bits based pruning and early termination for polar decoding in accordance with various aspects of the present disclosure. Wireless device 605 may be an example of aspects of a UE 115 or base station 105 as described herein. Wireless device 605 may include receiver 610, communications manager 615, and transmitter 620. Wireless device 605 may also include a processor. Each of these components may be in communication with one another (e.g., via one or more buses).

Receiver 610 may receive information such as packets, user data, or control information associated with various information channels (e.g., control channels, data channels, and information related to frozen bits based pruning and early termination for polar decoding, etc.). Information may be passed on to other components of the device. The receiver 610 may be an example of aspects of the transceiver 935 described with reference to FIG. 9. The receiver 610 may utilize a single antenna or a set of antennas.

Communications manager 615 may be an example of aspects of the communications manager 915 described with reference to FIG. 9. Communications manager 615 and/or at least some of its various sub-components may be implemented in hardware, software executed by a processor, firmware, or any combination thereof. If implemented in software executed by a processor, the functions of the communications manager 615 and/or at least some of its various sub-components may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The communications manager 615 and/or at least some of its various sub-components may be physically located at various positions, including being distributed such that portions of functions are implemented at different physical locations by one or more physical devices. In some examples, communications manager 615 and/or at least some of its various sub-components may be a separate and distinct component in accordance with various aspects of the present disclosure. In other examples, communications manager 615 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Communications manager 615 may, in combination with receiver 610, receive a candidate codeword via a communication channel. Communications manager 615 may then identify a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits, perform a decoding process for the candidate codeword based at least in part on the identified decoding hypothesis, the decoding process including, for each frozen bit location of at least a subset of the set of frozen bit locations, determining frozen bit path metrics for a set of decoding paths based on bit metrics for the set of decoding paths for the each frozen bit location and preceding ones of the at least the subset of the set of frozen bit locations and independent of bit metrics for the set of information bit locations, and discarding a subset of the set of decoding paths based on comparisons of the frozen bit path metrics for each of the set of decoding paths to a threshold frozen bit path metric, and determine whether to process the information bits of the candidate codeword based on a result of the decoding process.

Further, communications manager 615 may, in combination with receiver 610, receive a candidate codeword having a codeword length via a communication channel. Communications manager 615 may then identify a decoding hypothesis for decoding the candidate codeword based at least in part on the candidate codeword being encoded using a polar code having a plurality of bit locations, the decoding hypothesis associated with a plurality of information bit locations of the polar code corresponding to a plurality of information bits and a plurality of frozen bit locations of the polar code corresponding to a plurality of frozen bits, initiate a decoding process for the candidate codeword, the decoding process being performed according to the codeword length and the decoding hypothesis, and determine whether to terminate the decoding process as having failed to obtain the plurality of information bits based at least in part on evaluating bit metric information associated with a subset of the plurality of bit locations, the subset of the plurality of bit locations selected from the plurality of frozen bit locations based at least in part on the decoding hypothesis.

Transmitter 620 may transmit signals generated by other components of the device. In some examples, the transmitter 620 may be collocated with a receiver 610 in a transceiver module. For example, the transmitter 620 may be an example of aspects of the transceiver 935 described with reference to FIG. 9. The transmitter 620 may utilize a single antenna or a set of antennas.

Figure 7:
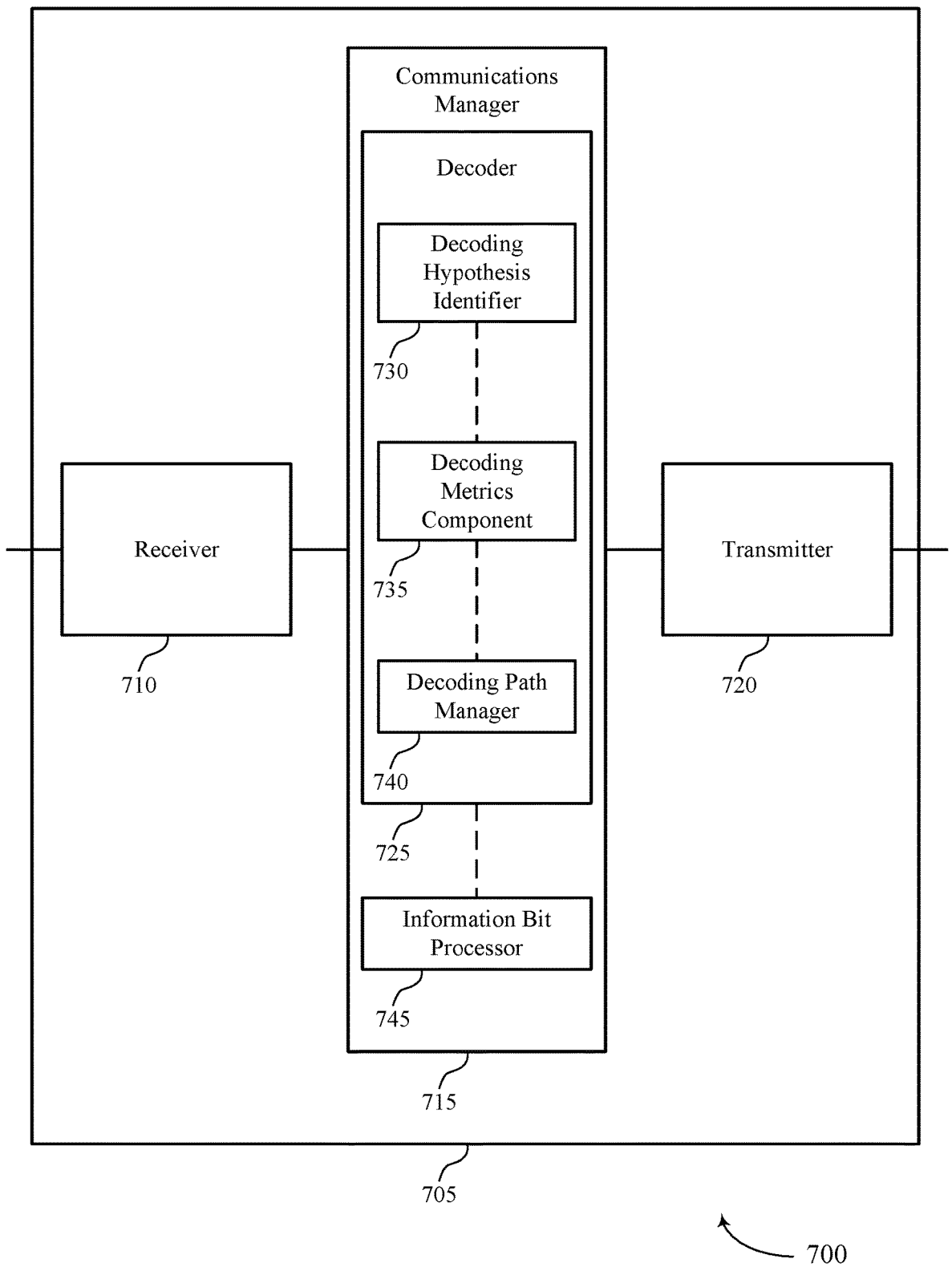

FIG. 7 shows a block diagram 700 of a wireless device 705 that supports frozen bits based pruning and early termination for polar decoding in accordance with various aspects of the present disclosure. Wireless device 705 may be an example of aspects of a wireless device 605 or a UE 115 or base station 105 as described with reference to FIG. 6. Wireless device 705 may include receiver 710, communications manager 715, and transmitter 720. Wireless device 705 may also include a processor. Each of these components may be in communication with one another (e.g., via one or more buses).

Receiver 710 may receive information such as packets, user data, or control information associated with various information channels (e.g., control channels, data channels, and information related to frozen bits based pruning and early termination for polar decoding, etc.). Information may be passed on to other components of the device. The receiver 710 may be an example of aspects of the transceiver 935 described with reference to FIG. 9. The receiver 710 may utilize a single antenna or a set of antennas.

Communications manager 715 may be an example of aspects of the communications manager 915 described with reference to FIG. 9. Communications manager 715 may include decoder 725 and information bit processor 745. Decoder 725 may include decoding hypothesis identifier 730, decoding metrics component 735, and decoding path manager 740. Communications manager 715 may, in combination with receiver 710, receive a candidate codeword via a communication channel. Decoding hypothesis identifier 730 may identify a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits.

Decoder 725 may then perform a decoding process for the candidate codeword based at least in part on the identified decoding hypothesis. In some cases, the decoding process may include functions performed by decoding metrics component 735 and decoding path manager 740 (e.g., for each frozen bit location of at least a subset of the set of frozen bit locations). In particular, decoding metrics component 735 may determine frozen bit path metrics for a set of decoding paths based on bit metrics for the set of decoding paths for the each frozen bit location and preceding ones of the at least the subset of the set of frozen bit locations and independent of bit metrics for the set of information bit locations.

Decoding path manager 740 may then discard a subset of the set of decoding paths based on comparisons of the frozen bit path metrics for each of the set of decoding paths to a threshold frozen bit path metric. In some cases, decoding path manager 740 may discard a subset of the set of decoding paths based on comparisons of the bit metrics for the set of decoding paths for the each frozen bit location to a threshold bit metric. In some cases, for the each frozen bit location, the frozen bit path metrics are determined based on a sum of the bit metrics for the each frozen bit location and the preceding ones of the at least the subset of the set of frozen bit locations. Information bit processor 745 may then determine whether to process the information bits based on a result of the decoding process.

Communications manager 715 may also, in combination with receiver 710, receive a candidate codeword having a codeword length via a communication channel. Decoding hypothesis identifier 730 may identify a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits. Decoder 725 may then initiate a decoding process for the candidate codeword, the decoding process being performed according to the codeword length and the decoding hypothesis. Communications manager 715 may then determine whether to terminate the decoding process as having failed to obtain the plurality of information bits based at least in part on evaluating bit metric information associated with a subset of the plurality of bit locations, the subset of the plurality of bit locations selected from the plurality of frozen bit locations based at least in part on the decoding hypothesis.

Transmitter 720 may transmit signals generated by other components of the device. In some examples, the transmitter 720 may be collocated with a receiver 710 in a transceiver module. For example, the transmitter 720 may be an example of aspects of the transceiver 935 described with reference to FIG. 9. The transmitter 720 may utilize a single antenna or a set of antennas.

Figure 8:
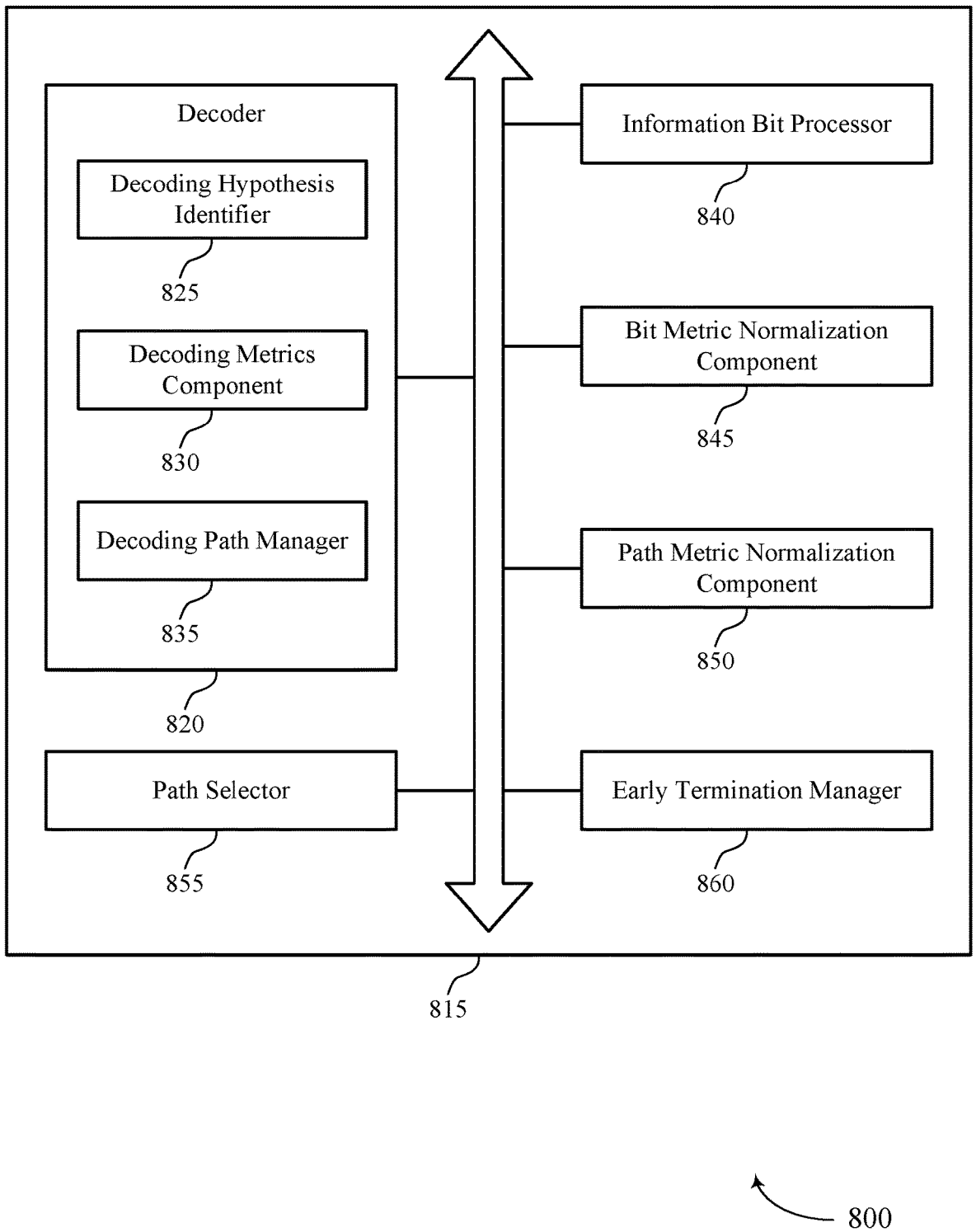

FIG. 8 shows a block diagram 800 of a communications manager 815 that supports frozen bits based pruning and early termination for polar decoding in accordance with various aspects of the present disclosure. The communications manager 815 may be an example of aspects of a communications manager 615, a communications manager 715, or a communications manager 915 described with reference to FIGS. 6, 7, and 9. The communications manager 815 may include decoder 820, information bit processor 840, bit metric normalization component 845, path metric normalization component 850, path selector 855, and early termination manager 860. Decoder 820 may include decoding hypothesis identifier 825, decoding metrics component 830, and decoding path manager 835. Each of these modules may communicate, directly or indirectly, with one another (e.g., via one or more buses).

Communications manager 815 may, in combination with a receiver, receive a candidate codeword via a communication channel. Decoding hypothesis identifier 825 may identify a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits.

Decoder 820 may then perform a decoding process for the candidate codeword based at least in part on the identified decoding hypothesis. In some cases, the decoding process may include functions performed by decoding metrics component 830 and decoding path manager 835 (e.g., for each frozen bit location of at least a subset of the set of frozen bit locations). In particular, decoding metrics component 830 may determine frozen bit path metrics for a set of decoding paths based on bit metrics for the set of decoding paths for the each frozen bit location and preceding ones of the at least the subset of the set of frozen bit locations and independent of bit metrics for the set of information bit locations. Decoding path manager 835 may then discard a subset of the set of decoding paths based on comparisons of the frozen bit path metrics for each of the set of decoding paths to a threshold frozen bit path metric. In some cases, decoding path manager 835 may discard a subset of the set of decoding paths based on comparisons of the bit metrics for the set of decoding paths for the each frozen bit location to a threshold bit metric.

In some cases, for the each frozen bit location, the frozen bit path metrics may be determined based on a sum of the bit metrics for the each frozen bit location and the preceding ones of the at least the subset of the set of frozen bit locations. In some cases, decoding metrics component 830 may determine first candidate path metrics for each of the set of decoding paths that are not discarded. In some cases, decoding metrics component 830 may, for an information bit location following the each frozen bit location, determine second candidate path metrics for an extended set of decoding paths based on the first candidate path metrics and bit metrics for the information bit location. In such cases, path selector 855 may select a subset of the extended set of decoding paths based on the second candidate path metrics. In some cases, the subset of the plurality of frozen bit locations are selected for evaluation based at least in part on the decoding hypothesis or reliability information for the plurality of frozen bit locations.

Information bit processor 840 may then determine whether to process the information bits based on a result of the decoding process. In some cases, information bit processor 840 may determine, subsequent to the decoding process for all of the set of frozen bit locations, that at least one decoding path of the set of decoding paths is not discarded, identify the information bits based on the at least one decoding path, and process the information bits based on the identification. In other cases, information bit processor 840 may determine that all decoding paths of the set of decoding paths are discarded, and early termination manager 860 may terminate decoding of the codeword.

Bit metric normalization component 845 may normalize bit metrics determined by decoding metrics component 830. For instance, bit metric normalization component 845 may normalize bit metrics determined by decoding metrics component 830 based on reliability information for the each frozen bit location or an aggregate of LLR magnitudes for the codeword. Path metric normalization component 850 may normalize path metrics determined by decoding metrics component 830. For instance, path metric normalization component 850 may normalize the frozen bit path metrics based on a number of bit locations corresponding to the each frozen bit location and the preceding ones of the at least the subset of the set of frozen bit locations, reliability information for bit locations corresponding to the each frozen bit location and the preceding ones of the at least the subset of the set of frozen bit locations, or an aggregate of LLR magnitudes for the codeword.

Communications manager 815 may also, in combination with a receiver, receive a candidate codeword having a codeword length via a communication channel. Decoding hypothesis identifier 825 may identify a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits. Decoder 820 may then initiate a decoding process for the candidate codeword, the decoding process being performed according to the codeword length and the decoding hypothesis. Early termination manager 860 may determine whether to terminate the decoding process as having failed to obtain the plurality of information bits based at least in part on evaluating bit metric information associated with a subset of the plurality of bit locations, the subset of the plurality of bit locations selected from the plurality of frozen bit locations based at least in part on the decoding hypothesis. In some cases, the decoding process comprises successively decoding the plurality of bit locations. In such cases, the decoding process may comprise a successive cancellation (SC) decoding process or an SCL decoding process.

Figure 9:
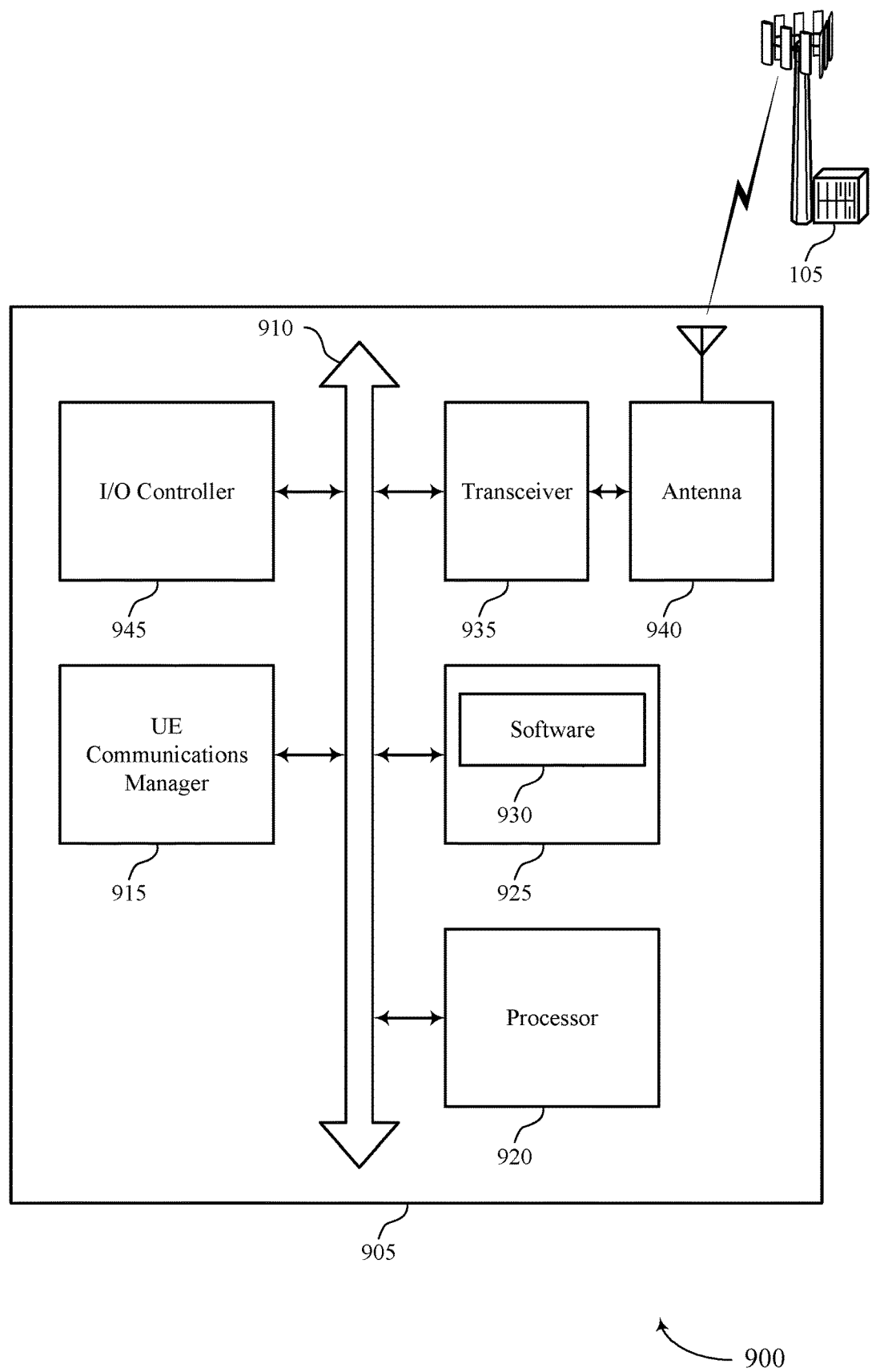
FIG. 9 illustrates a block diagram of a system including a user equipment (UE) that supports frozen bits based pruning and early termination for polar decoding in accordance with various aspects of the present disclosure.

FIG. 9 shows a diagram of a system 900 including a device 905 that supports frozen bits based pruning and early termination for polar decoding in accordance with various aspects of the present disclosure. Device 905 may be an example of or include the components of wireless device 605, wireless device 705, or a UE 115 as described above, e.g., with reference to FIGS. 6 and 7. Device 905 may include components for bi-directional voice and data communications including components for transmitting and receiving communications, including UE communications manager 915, processor 920, memory 925, software 930, transceiver 935, antenna 940, and I/O controller 945. These components may be in electronic communication via one or more buses (e.g., bus 910). Device 905 may communicate wirelessly with one or more base stations 105.

Processor 920 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 920 may be configured to operate a memory array using a memory controller. In other cases, a memory controller may be integrated into processor 920. Processor 920 may be configured to execute computer-readable instructions stored in memory to perform various functions (e.g., functions or tasks supporting frozen bits based pruning and early termination for polar decoding).

Memory 925 may include random access memory (RAM) and read only memory (ROM). The memory 925 may store computer-readable, computer-executable software 930 including instructions that, when executed, cause the processor to perform various functions described herein. In some cases, the memory 925 may contain, among other things, a basic input/output system (BIOS) which may control basic hardware or software operation such as the interaction with peripheral components or devices.

Software 930 may include code to implement aspects of the present disclosure, including code to support frozen bits based pruning and early termination for polar decoding. Software 930 may be stored in a non-transitory computer-readable medium such as system memory or other memory. In some cases, the software 930 may not be directly executable by the processor but may cause a computer (e.g., when compiled and executed) to perform functions described herein.

Transceiver 935 may communicate bi-directionally, via one or more antennas, wired, or wireless links as described above. For example, the transceiver 935 may represent a wireless transceiver and may communicate bi-directionally with another wireless transceiver. The transceiver 935 may also include a modem to modulate the packets and provide the modulated packets to the antennas for transmission, and to demodulate packets received from the antennas.

In some cases, the wireless device may include a single antenna 940. However, in other cases, the device may have more than one antenna 940, which may be capable of concurrently transmitting or receiving multiple wireless transmissions.

I/O controller 945 may manage input and output signals for device 905. I/O controller 945 may also manage peripherals not integrated into device 905. In some cases, I/O controller 945 may represent a physical connection or port to an external peripheral. In some cases, I/O controller 945 may utilize an operating system such as iOS®, ANDROID®, MS-DOS®, MS-WINDOWS®, OS/2®, UNIX®, LINUX®, or another known operating system. In other cases, I/O controller 945 may represent or interact with a modem, a keyboard, a mouse, a touchscreen, or a similar device. In some cases, I/O controller 945 may be implemented as part of a processor. In some cases, a user may interact with device 905 via I/O controller 945 or via hardware components controlled by I/O controller 945.

Figure 10:
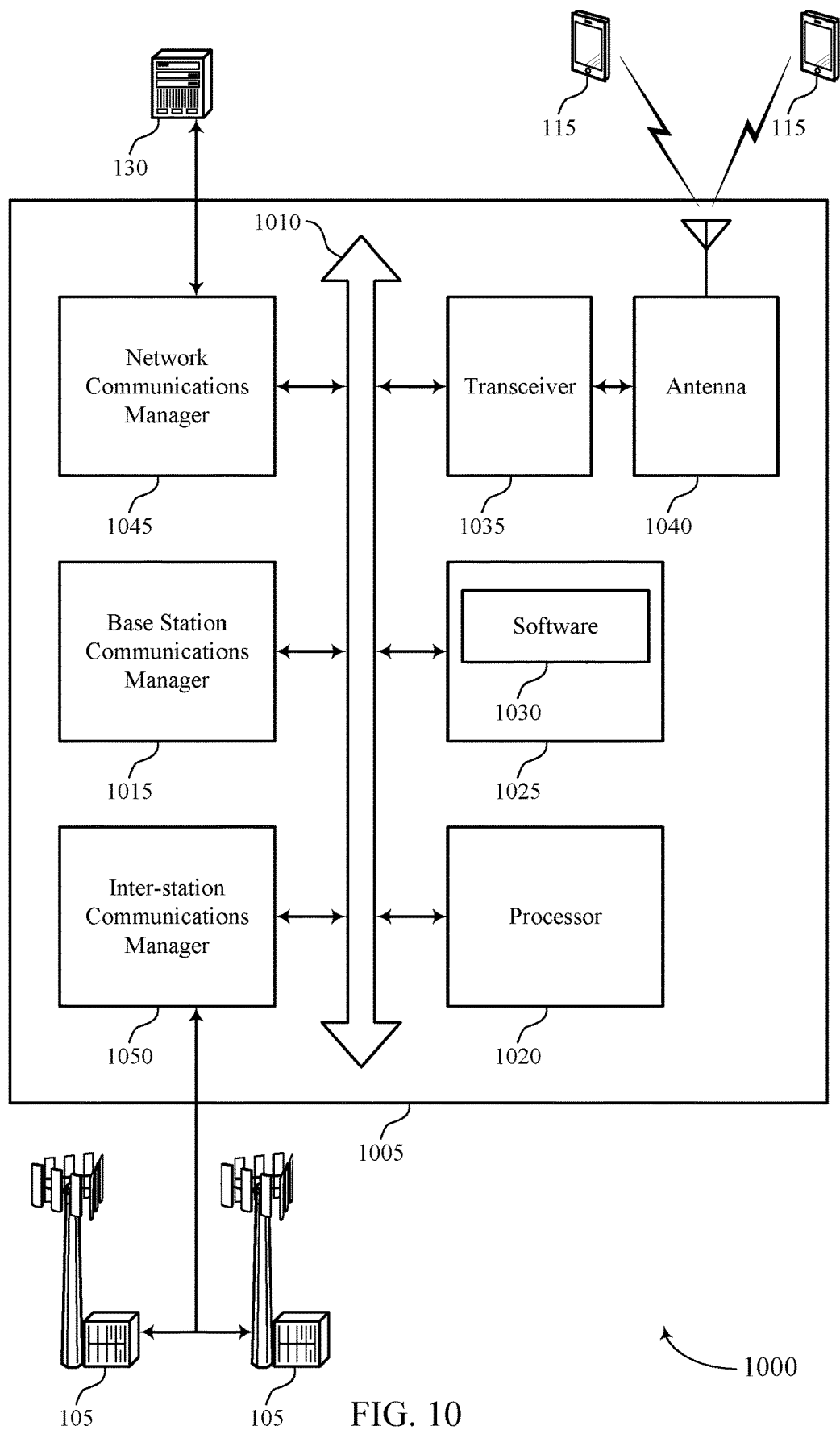
FIG. 10 illustrates a block diagram of a system including a base station that supports frozen bits based pruning and early termination for polar decoding in accordance with various aspects of the present disclosure.

FIG. 10 shows a diagram of a system 1000 including a device 1005 that supports frozen bits based pruning and early termination for polar decoding in accordance with various aspects of the present disclosure. Device 1005 may be an example of or include the components of wireless device 605, wireless device 705, or a base station 105 as described above, e.g., with reference to FIGS. 6 and 7. Device 1005 may include components for bi-directional voice and data communications including components for transmitting and receiving communications, including base station communications manager 1015, processor 1020, memory 1025, software 1030, transceiver 1035, antenna 1040, network communications manager 1045, and inter-station communications manager 1050. These components may be in electronic communication via one or more buses (e.g., bus 1010). Device 1005 may communicate wirelessly with one or more UEs 115.

Processor 1020 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1020 may be configured to operate a memory array using a memory controller. In other cases, a memory controller may be integrated into processor 1020. Processor 1020 may be configured to execute computer-readable instructions stored in a memory to perform various functions (e.g., functions or tasks supporting frozen bits based pruning and early termination for polar decoding).

Memory 1025 may include RAM and ROM. The memory 1025 may store computer-readable, computer-executable software 1030 including instructions that, when executed, cause the processor to perform various functions described herein. In some cases, the memory 1025 may contain, among other things, a BIOS which may control basic hardware or software operation such as the interaction with peripheral components or devices.

Software 1030 may include code to implement aspects of the present disclosure, including code to support frozen bits based pruning and early termination for polar decoding. Software 1030 may be stored in a non-transitory computer-readable medium such as system memory or other memory. In some cases, the software 1030 may not be directly executable by the processor but may cause a computer (e.g., when compiled and executed) to perform functions described herein.

Transceiver 1035 may communicate bi-directionally, via one or more antennas, wired, or wireless links as described above. For example, the transceiver 1035 may represent a wireless transceiver and may communicate bi-directionally with another wireless transceiver. The transceiver 1035 may also include a modem to modulate the packets and provide the modulated packets to the antennas for transmission, and to demodulate packets received from the antennas.

In some cases, the wireless device may include a single antenna 1040. However, in other cases, the device may have more than one antenna 1040, which may be capable of concurrently transmitting or receiving multiple wireless transmissions.

Network communications manager 1045 may manage communications with the core network (e.g., via one or more wired backhaul links). For example, the network communications manager 1045 may manage the transfer of data communications for client devices, such as one or more UEs 115.

Inter-station communications manager 1050 may manage communications with other base station 105, and may include a controller or scheduler for controlling communications with UEs 115 in cooperation with other base stations 105. For example, the inter-station communications manager 1050 may coordinate scheduling for transmissions to UEs 115 for various interference mitigation techniques such as beamforming or joint transmission. In some examples, inter-station communications manager 1050 may provide an X2 interface within an LTE/LTE-A wireless communication network technology to provide communication between base stations 105.

Figure 11:
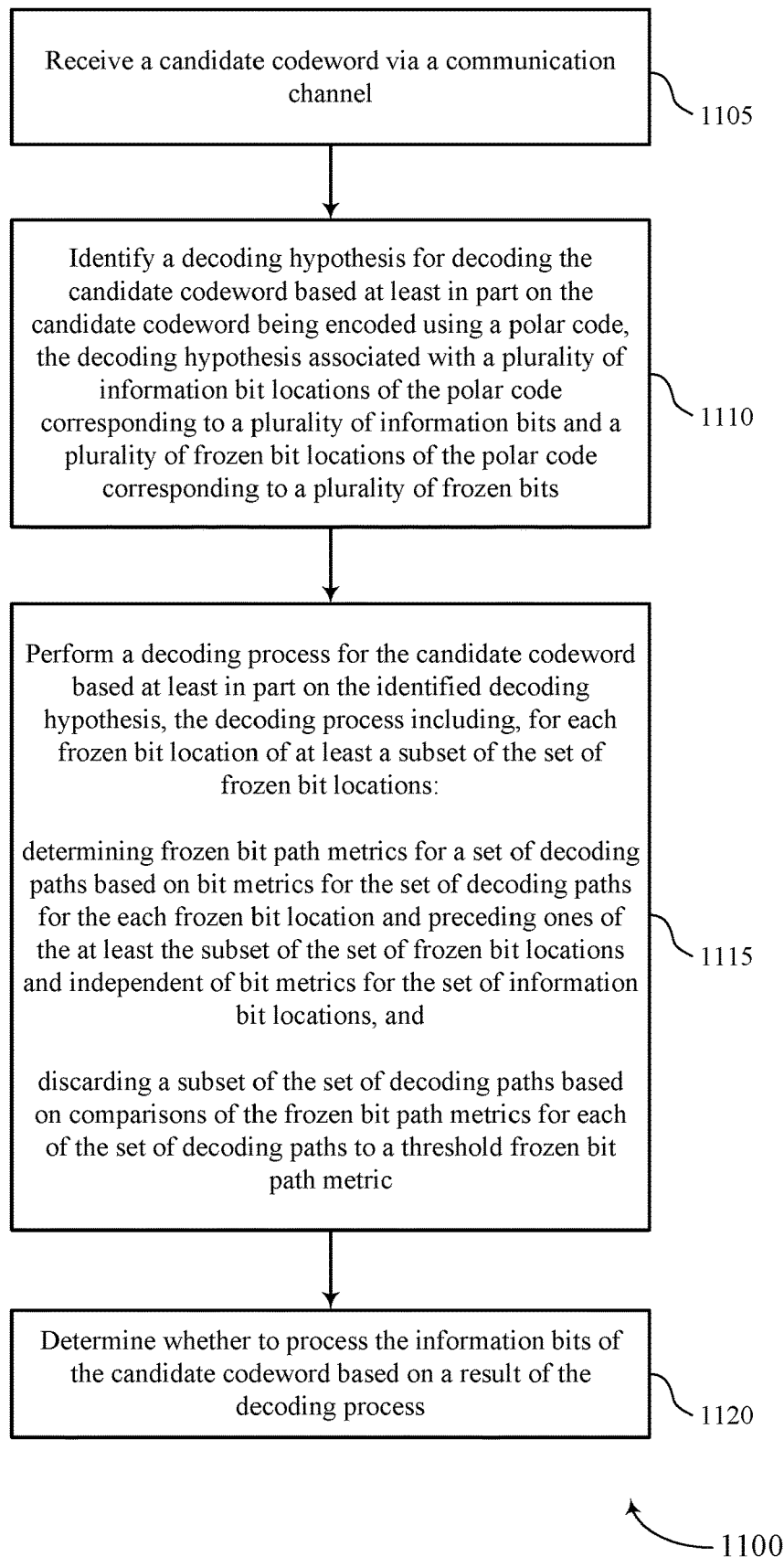
FIGS. 11-13 illustrate methods for frozen bits based pruning and early termination for polar decoding in accordance with various aspects of the present disclosure.

FIG. 11 shows a flowchart illustrating a method 1100 for frozen bits based pruning and early termination for polar decoding in accordance with various aspects of the present disclosure. The operations of method 1100 may be implemented by a UE 115 or base station 105 or its components as described herein. For example, the operations of method 1100 may be performed by a communications manager as described with reference to FIGS. 6-8. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1105, the UE 115 or base station 105 may receive a candidate codeword via a communication channel. The operations of block 1105 may be performed according to the methods described herein. In certain examples, aspects of the operations of block 1105 may be performed by a receiver as described with reference to FIGS. 6-8.

At block 1110, the UE 115 or base station 105 may identify a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits. The operations of block 1110 may be performed according to the methods described herein. In certain examples, aspects of the operations of block 1110 may be performed by a decoding hypothesis identifier as described with reference to FIGS. 6-8.

At block 1115, the UE 115 or base station 105 may perform a decoding process for the candidate codeword based at least in part on the identified decoding hypothesis, the decoding process comprising, for each frozen bit location of at least a subset of the plurality of frozen bit locations, determining frozen bit path metrics for a set of decoding paths based at least in part on bit metrics for the set of decoding paths for the each frozen bit location and preceding ones of the at least the subset of the plurality of frozen bit locations and independent of bit metrics for the plurality of information bit locations, and discarding a subset of the set of decoding paths based at least in part on comparisons of the frozen bit path metrics for each of the set of decoding paths to a threshold frozen bit path metric. The operations of block 1115 may be performed according to the methods described herein. In certain examples, aspects of the operations of block 1115 may be performed by a decoder, decoding metrics component, and a decoding path manager as described with reference to FIGS. 6-8.

At block 1120, the UE 115 or base station 105 may determine whether to process the information bits of the candidate codeword based at least in part on a result of the decoding process. The operations of block 1120 may be performed according to the methods described herein. In certain examples, aspects of the operations of block 1120 may be performed by a communications manager as described with reference to FIGS. 6-8.

Figure 12:
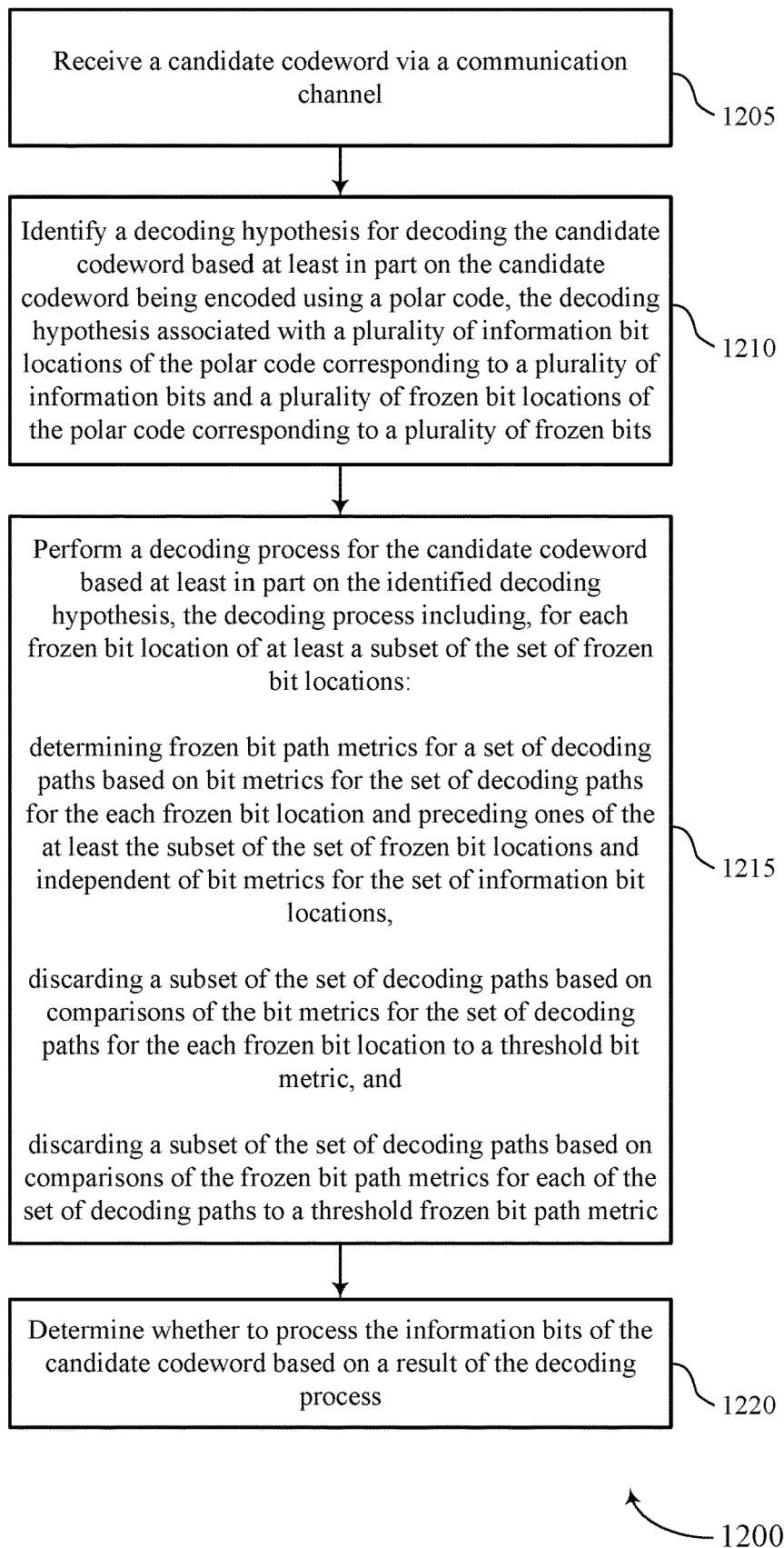

FIG. 12 shows a flowchart illustrating a method 1200 for frozen bits based pruning and early termination for polar decoding in accordance with various aspects of the present disclosure. The operations of method 1200 may be implemented by a UE 115 or base station 105 or its components as described herein. For example, the operations of method 1200 may be performed by a communications manager as described with reference to FIGS. 6-8. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1205, the UE 115 or base station 105 may receive a candidate codeword via a communication channel. The operations of block 1205 may be performed according to the methods described herein. In certain examples, aspects of the operations of block 1205 may be performed by a receiver as described with reference to FIGS. 6-8.

At block 1210, the UE 115 or base station 105 may identify a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits. The operations of block 1210 may be performed according to the methods described herein. In certain examples, aspects of the operations of block 1210 may be performed by a decoding hypothesis identifier as described with reference to FIGS. 6-8.

At block 1215, the UE 115 or base station 105 may perform a decoding process for the candidate codeword based at least in part on the identified decoding hypothesis, the decoding process comprising, for each frozen bit location of at least a subset of the plurality of frozen bit locations, determining frozen bit path metrics for a set of decoding paths based at least in part on bit metrics for the set of decoding paths for the each frozen bit location and preceding ones of the at least the subset of the plurality of frozen bit locations and independent of bit metrics for the plurality of information bit locations, discarding a subset of the set of decoding paths based on comparisons of the bit metrics for the set of decoding paths for the each frozen bit location to a threshold bit metric, and discarding a subset of the set of decoding paths based at least in part on comparisons of the frozen bit path metrics for each of the set of decoding paths to a threshold frozen bit path metric. The operations of block 1215 may be performed according to the methods described herein. In certain examples, aspects of the operations of block 1215 may be performed by a decoder, decoding metrics component, and decoding path manager as described with reference to FIGS. 6-8.

At block 1220, the UE 115 or base station 105 may determine whether to process the information bits of the candidate codeword based at least in part on a result of the decoding process. The operations of block 1220 may be performed according to the methods described herein. In certain examples, aspects of the operations of block 1220 may be performed by a communications manager as described with reference to FIGS. 6-8.

Figure 13:
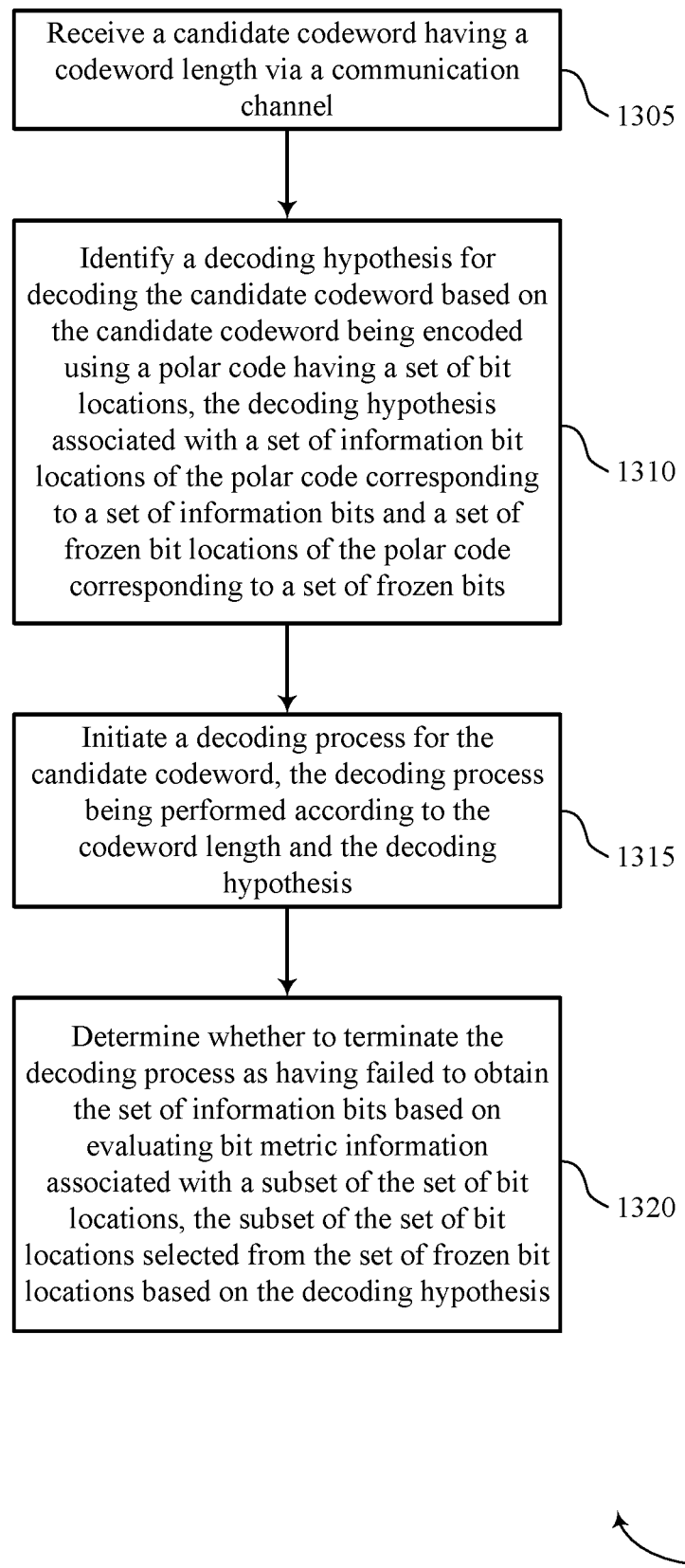

FIG. 13 shows a flowchart illustrating a method 1300 for frozen bits based pruning and early termination for polar decoding in accordance with various aspects of the present disclosure. The operations of method 1300 may be implemented by a UE 115 or base station 105 or its components as described herein. For example, the operations of method 1300 may be performed by a communications manager as described with reference to FIGS. 6-8. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1305, the UE 115 or base station 105 may receive a candidate codeword having a codeword length via a communication channel. The operations of block 1305 may be performed according to the methods described herein. In certain examples, aspects of the operations of block 1305 may be performed by a receiver as described with reference to FIGS. 6-8.

At block 1310, the UE 115 or base station 105 may identify a decoding hypothesis for decoding the candidate codeword based at least in part on the candidate codeword being encoded using a polar code having a set of bit locations, the decoding hypothesis associated with a set of information bit locations of the polar code corresponding to a set of information bits and a set of frozen bit locations of the polar code corresponding to a set of frozen bits. The operations of block 1310 may be performed according to the methods described herein. In certain examples, aspects of the operations of block 1310 may be performed by a decoding hypothesis identifier as described with reference to FIGS. 6-8.

At block 1315, the UE 115 or base station 105 may initiate a decoding process for the candidate codeword, the decoding process being performed according to the codeword length and the decoding hypothesis. The operations of block 1315 may be performed according to the methods described herein. In certain examples, aspects of the operations of block 1315 may be performed by a decoder as described with reference to FIGS. 6-8.

At block 1320, the UE 115 or base station 105 may determine whether to terminate the decoding process as having failed to obtain the set of information bits based at least in part on evaluating bit metric information associated with a subset of the set of bit locations, the subset of the set of bit locations selected from the set of frozen bit locations based at least in part on the decoding hypothesis. The operations of block 1320 may be performed according to the methods described herein. In certain examples, aspects of the operations of block 1320 may be performed by an early termination manager as described with reference to FIGS. 6-8.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of eNBs provide coverage for various geographical regions. For example, each eNB, next generation NodeB (gNB), or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), gNB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 and 200 of FIGS. 1 and 2—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
   receiving a candidate codeword via a communication channel;
   identifying a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits;
   performing a decoding process for the candidate codeword based at least in part on the identified decoding hypothesis, the decoding process comprising, for each frozen bit location of at least a subset of the plurality of frozen bit locations:
      determining frozen bit path metrics for a set of decoding paths based at least in part on bit metrics for the set of decoding paths for the each frozen bit location and preceding ones of the at least the subset of the plurality of frozen bit locations and independent of bit metrics for the plurality of information bit locations, wherein the frozen bit path metrics are normalized based at least in part on a characteristic of the decoding process or the candidate codeword; and
      discarding a subset of the set of decoding paths based at least in part on comparisons of the frozen bit path metrics for each of the set of decoding paths to a threshold frozen bit path metric; and
   determining whether to process the information bits of the candidate codeword based at least in part on a result of the decoding process.

2. The method of claim 1, wherein the performing the decoding process further comprises, for the each frozen bit location:
   discarding a subset of the set of decoding paths based at least in part on comparisons of the bit metrics for the set of decoding paths for the each frozen bit location to a threshold bit metric.

3. The method of claim 2, wherein the bit metrics for the set of decoding paths for the each frozen bit location are based at least in part on reliability information for the each frozen bit location or an aggregate of logarithmic-likelihood ratio (LLR) magnitudes for the candidate codeword.

4. The method of claim 1, wherein the determining the frozen bit path metrics for the set of decoding paths further comprises:
   determining the frozen bit path metrics based at least in part on a number of bit locations corresponding to the each frozen bit location and the preceding ones of the at least the subset of the plurality of frozen bit locations, reliability information for bit locations corresponding to the each frozen bit location and the preceding ones of the at least the subset of the plurality of frozen bit locations, or an aggregate of logarithmic-likelihood ratio (LLR) magnitudes for the candidate codeword.

5. The method of claim 1, wherein, for the each frozen bit location, the frozen bit path metrics are determined based at least in part on a sum of the bit metrics for the each frozen bit location and the preceding ones of the at least the subset of the plurality of frozen bit locations.

6. The method of claim 1, wherein the performing the decoding process further comprises, for the each frozen bit location:
   determining first candidate path metrics for each of the set of decoding paths that are not discarded.

7. The method of claim 6, wherein the performing the decoding process further comprises, for an information bit location following the each frozen bit location:
   determining second candidate path metrics for an extended set of decoding paths based at least in part on the first candidate path metrics and bit metrics for the information bit location; and
   selecting a subset of the extended set of decoding paths based at least in part on the second candidate path metrics.

8. The method of claim 1, wherein the determining whether to process the information bits comprises:
   determining that all decoding paths of the set of decoding paths are discarded; and
   terminating decoding of the candidate codeword.

9. The method of claim 1, wherein the determining whether to process the information bits comprises:
   determining, subsequent to the decoding process for all of the plurality of frozen bit locations, that at least one decoding path of the set of decoding paths is not discarded;
   identifying the information bits based at least in part on the at least one decoding path; and
   processing the information bits based at least in part on the identification.

10. The method of claim 1, wherein the subset of the plurality of frozen bit locations are selected for evaluation based at least in part on the decoding hypothesis or reliability information for the plurality of frozen bit locations.

11. A method for wireless communication, comprising:
   receiving a candidate codeword having a codeword length via a communication channel;
   identifying a decoding hypothesis for decoding the candidate codeword based at least in part on the candidate codeword being encoded using a polar code having a plurality of bit locations, the decoding hypothesis associated with a plurality of information bit locations of the polar code corresponding to a plurality of information bits and a plurality of frozen bit locations of the polar code corresponding to a plurality of frozen bits;

initiating a decoding process for the candidate codeword, the decoding process being performed according to the codeword length and the decoding hypothesis; and determining whether to terminate the decoding process as having failed to obtain the plurality of information bits based at least in part on evaluating bit metric information associated with a subset of the plurality of bit locations, the subset of the plurality of bit locations selected from the plurality of frozen bit locations based at least in part on the decoding hypothesis, wherein the bit metric information is normalized based at least in part on a characteristic of the decoding process or the candidate codeword.

12. The method of claim 11, wherein the decoding process comprises successively decoding the plurality of bit locations.

13. The method of claim 12, wherein the decoding process comprises a successive cancellation (SC) decoding process.

14. The method of claim 12, wherein the decoding process comprises a successive cancellation list (SCL) decoding process.

15. An apparatus for wireless communication, comprising:
a processor;
memory in electronic communication with the processor; and
instructions stored in the memory and operable, when executed by the processor, to cause the apparatus to:
receive a candidate codeword via a communication channel;
identify a decoding hypothesis for decoding the candidate codeword based at least in part on the candidate codeword being encoded using a polar code, the decoding hypothesis associated with a plurality of information bit locations of the polar code corresponding to a plurality of information bits and a plurality of frozen bit locations of the polar code corresponding to a plurality of frozen bits;
perform a decoding process for the candidate codeword based at least in part on the identified decoding hypothesis, the decoding process comprising, for each frozen bit location of at least a subset of the plurality of frozen bit locations:
determine frozen bit path metrics for a set of decoding paths based at least in part on bit metrics for the set of decoding paths for the each frozen bit location and preceding ones of the at least the subset of the plurality of frozen bit locations and independent of bit metrics for the plurality of information bit locations, wherein the frozen bit path metrics are normalized based at least in part on a characteristic of the decoding process or the candidate codeword; and
discard a subset of the set of decoding paths based at least in part on comparisons of the frozen bit path metrics for each of the set of decoding paths to a threshold frozen bit path metric; and
determine whether to process the information bits of the candidate codeword based at least in part on a result of the decoding process.

16. The apparatus of claim 15, wherein the instructions are further executable by the processor to cause the apparatus to, for the each frozen bit location:
discard a subset of the set of decoding paths based at least in part on comparisons of the bit metrics for the set of decoding paths for the each frozen bit location to a threshold bit metric.

17. The apparatus of claim 16, wherein the bit metrics for the set of decoding paths for the each frozen bit location are based at least in part on reliability information for the each frozen bit location or an aggregate of logarithmic-likelihood ratio (LLR) magnitudes for the candidate codeword.

18. The apparatus of claim 15, wherein the instructions are further executable by the processor to cause the apparatus to:
determine the frozen bit path metrics based at least in part on a number of bit locations corresponding to the each frozen bit location and the preceding ones of the at least the subset of the plurality of frozen bit locations, reliability information for bit locations corresponding to the each frozen bit location and the preceding ones of the at least the subset of the plurality of frozen bit locations, or an aggregate of logarithmic-likelihood ratio (LLR) magnitudes for the candidate codeword.

19. The apparatus of claim 15, wherein, for the each frozen bit location, the frozen bit path metrics are determined based at least in part on a sum of the bit metrics for the each frozen bit location and the preceding ones of the at least the subset of the plurality of frozen bit locations.

20. The apparatus of claim 15, wherein the instructions are further executable by the processor to cause the apparatus to, for the each frozen bit location:
determine first candidate path metrics for each of the set of decoding paths that are not discarded.

21. The apparatus of claim 20, wherein the instructions are further executable by the processor to cause the apparatus to, for an information bit location following the each frozen bit location:
determine second candidate path metrics for an extended set of decoding paths based at least in part on the first candidate path metrics and bit metrics for the information bit location; and
select a subset of the extended set of decoding paths based at least in part on the second candidate path metrics.

22. The apparatus of claim 15, wherein the instructions are further executable by the processor to cause the apparatus to:
determine that all decoding paths of the set of decoding paths are discarded; and
terminate decoding of the candidate codeword.

23. The apparatus of claim 15, wherein the instructions are further executable by the processor to cause the apparatus to:
determine, subsequent to the decoding process for all of the plurality of frozen bit locations, that at least one decoding path of the set of decoding paths is not discarded;
identify the information bits based at least in part on the at least one decoding path; and
process the information bits based at least in part on the identification.

24. The apparatus of claim 15, wherein the subset of the plurality of frozen bit locations are selected for evaluation based at least in part on the decoding hypothesis or reliability information for the plurality of frozen bit locations.

25. An apparatus for wireless communication, comprising:
a processor;
memory in electronic communication with the processor; and
instructions stored in the memory and operable, when executed by the processor, to cause the apparatus to:
receive a candidate codeword having a codeword length via a communication channel;

identify a decoding hypothesis for decoding the candidate codeword based at least in part on the candidate codeword being encoded using a polar code having a plurality of bit locations, the decoding hypothesis associated with a plurality of information bit locations of the polar code corresponding to a plurality of information bits and a plurality of frozen bit locations of the polar code corresponding to a plurality of frozen bits;

initiate a decoding process for the candidate codeword, the decoding process being performed according to the codeword length and the decoding hypothesis; and determine whether to terminate the decoding process as having failed to obtain the plurality of information bits based at least in part on evaluating bit metric information associated with a subset of the plurality of bit locations, the subset of the plurality of bit locations selected from the plurality of frozen bit locations based at least in part on the decoding hypothesis, wherein the bit metric information is normalized based at least in part on a characteristic of the decoding process or the candidate codeword.

26. The apparatus of claim 25, wherein the decoding process comprises successively decoding the plurality of bit locations.

27. The apparatus of claim 26, wherein the decoding process comprises a successive cancellation (SC) decoding process.

28. The apparatus of claim 26, wherein the decoding process comprises a successive cancellation list (SCL) decoding process.

* * * * *